United States Patent
Nagayama et al.

(10) Patent No.: US 11,846,662 B2
(45) Date of Patent: Dec. 19, 2023

(54) PULSE TRAIN SIGNAL CYCLE ESTIMATION DEVICE, PULSE TRAIN SIGNAL CYCLE ESTIMATION METHOD, AND PULSE TRAIN SIGNAL CYCLE ESTIMATION PROGRAM

(71) Applicant: NIPPON TELEGRAPH AND TELEPHONE CORPORATION, Tokyo (JP)

(72) Inventors: Hiroki Nagayama, Musashino (JP); Shingo Kashima, Musashino (JP); Masaki Tanikawa, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 318 days.

(21) Appl. No.: 17/430,326

(22) PCT Filed: Feb. 19, 2020

(86) PCT No.: PCT/JP2020/006627
§ 371 (c)(1),
(2) Date: Aug. 12, 2021

(87) PCT Pub. No.: WO2020/171145
PCT Pub. Date: Aug. 27, 2020

(65) Prior Publication Data
US 2022/0128607 A1      Apr. 28, 2022

(30) Foreign Application Priority Data
Feb. 21, 2019   (JP) .................................. 2019-029890

(51) Int. Cl.
*G01R 23/10*       (2006.01)
*G01R 23/15*       (2006.01)

(52) U.S. Cl.
CPC ............. *G01R 23/10* (2013.01); *G01R 23/15* (2013.01)

(58) Field of Classification Search
CPC . G01R 23/10; G01R 25/08; G01R 31/318527
See application file for complete search history.

(56) References Cited

U.S. PATENT DOCUMENTS

| | | | | |
|---|---|---|---|---|
| 5,381,150 A | * | 1/1995 | Hawkins | G01R 23/165 342/13 |
| 6,242,918 B1 | * | 6/2001 | Miller | G01R 33/3628 324/318 |
| 2009/0285137 A1 | * | 11/2009 | Fujita | H04L 27/261 375/295 |

OTHER PUBLICATIONS

Mardia, "New Techniques for the Deinterleaving of Repetitive Sequences", IEE Proceedings, vol. 136, Issue 4, Aug. 1989, pp. 149-154.

(Continued)

*Primary Examiner* — Tung X Nguyen
(74) *Attorney, Agent, or Firm* — XSENSUS LLP

(57) ABSTRACT

A period estimation apparatus includes processing circuitry configured to extract candidate periods being a target of period determination from an input pulse train, use at least one of the candidate periods extracted to determine whether the at least one of the candidate periods exists as an actual period, and, when determining that the at least one of the candidate periods does not exist as the actual period, suspend the period determination for the at least one of the candidate periods, perform the period determination for the at least one of the candidate periods determined to exist as the actual period, generate a pseudo periodic pulse train, adjust, based on a differential value between the pseudo periodic pulse train generated and the input pulse train, a pulse position of the pseudo periodic pulse train, and detect (Continued)

a periodic pulse train according to results of the period determination and adjustment.

13 Claims, 30 Drawing Sheets

(56) References Cited

OTHER PUBLICATIONS

Davies et al., "Automatic Processing for ESM", Current Electronic-Support-Measure Receivers, IEE Proc., vol. 129, Issue 3, Jun. 1982, pp. 164-171.
Nishiguchi et al., "Improved Algorithm for Estimating Pulse Repetition Intervals", IEEE Transactions on Aerospace and Electronic Systems, vol. 36, Issue 2, Apr. 2000, pp. 407-421.
Liu et al., "Improved Method for Deinterleaving Radar Signals and Estimating PRI Values", IET Radar, Sonar & Navigation, IET Journals, vol. 12, Issue 5, Apr. 2018, pp. 506-514.
Nagayama et al., "Period Analysis for Visualization of Industrial Network", The Institute of Electronics, Information and Communication Engineers, Technical Report of IEICE, Available Online at: https://ipsj.ixsq.nii.ac.jp/ej/index.php?active_action=repository_view_main_item_detail&page_id=13&block_id=8&item_id=194928&item_no=1, Feb. 28, 2019, 6 pages (Including English Abstract).

* cited by examiner

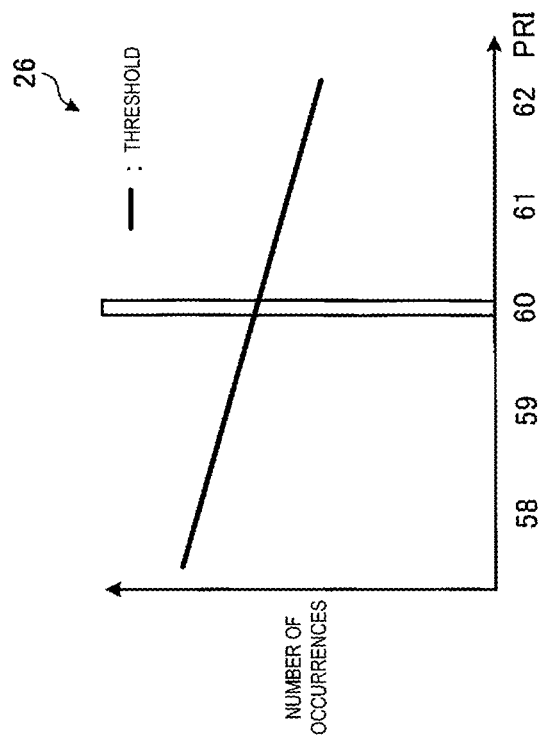
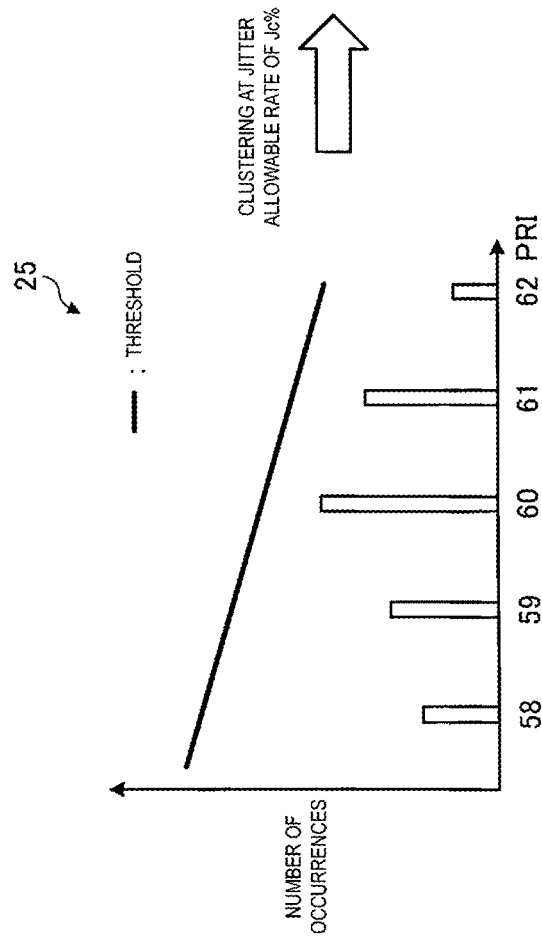
Fig. 4

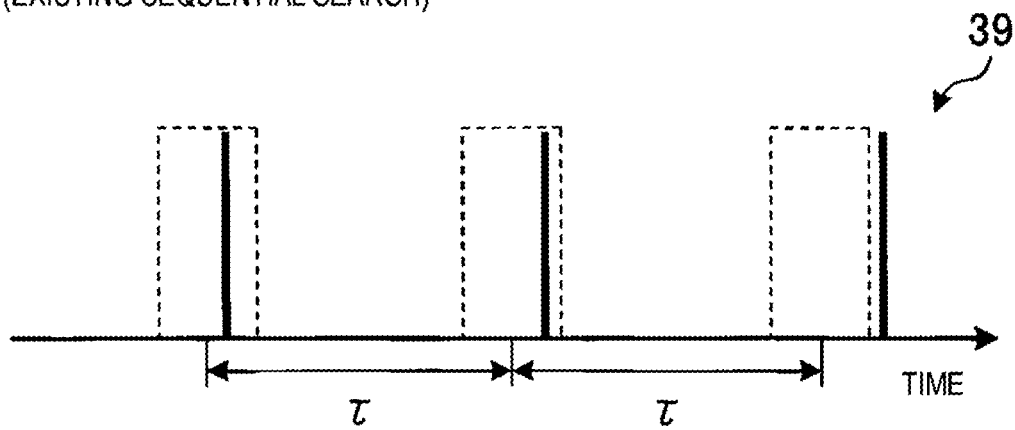
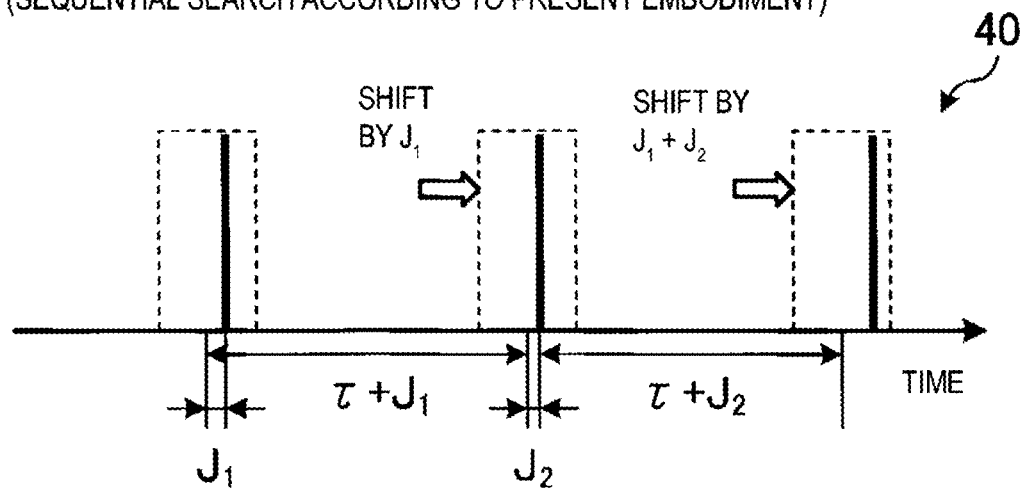
Fig. 10

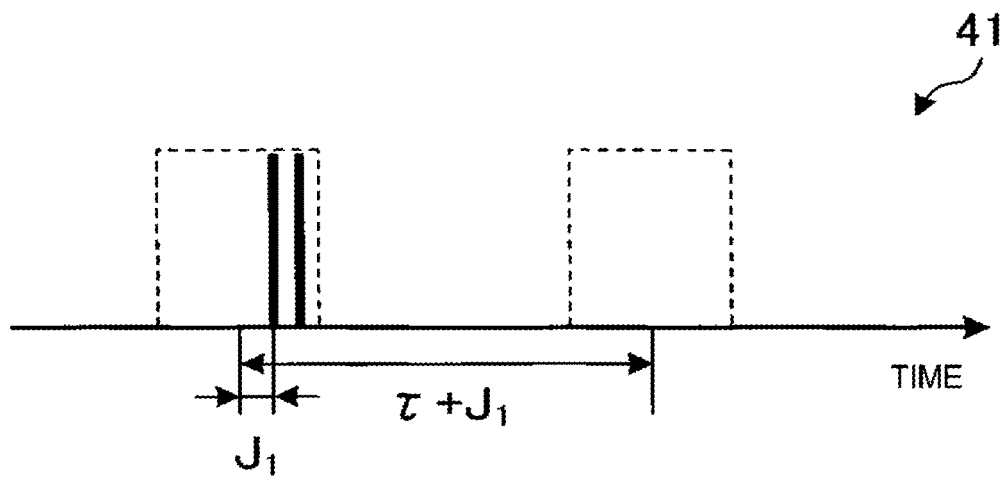
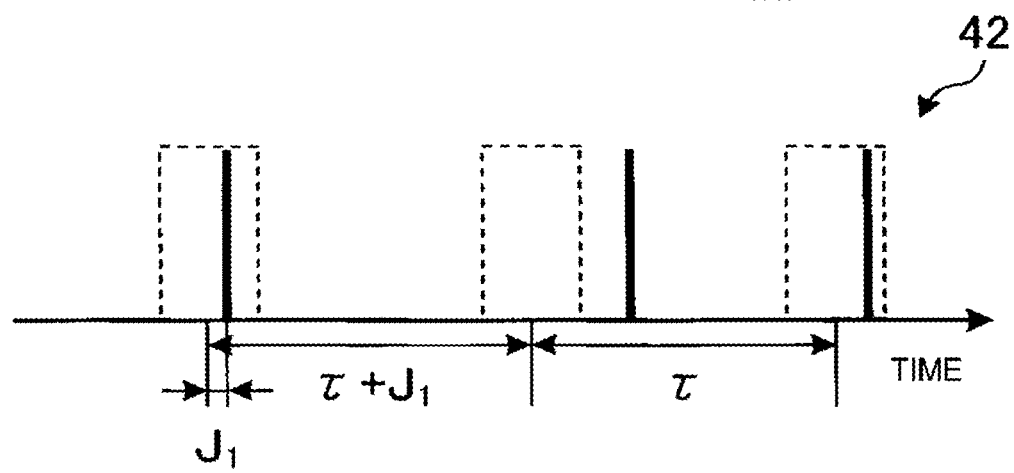
Fig. 11

[CALCULATION RESULTS ACCORDING TO EXISTING METHOD] 55

| EXPERIMENTAL DATA | PERIOD | CALCULATION TIME |
|---|---|---|
| SINGLE PERIOD | 60.0 | 0.398 |
| SINGLE PERIOD + NOISE | 600.0, 1800.0 (ERRONEOUS EXTRACTION) | 196 |
| PLURALITY OF PERIODS | 9.0, 60.0 | 31.2 |
| Stagger PULSE | 2400.0 | 67.9 |
| RANDOM COMMUNICATION | 0 | 537 |

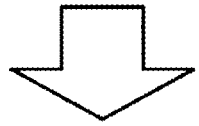

[CALCULATION RESULTS ACCORDING TO PRESENT EMBODIMENT] 56

| EXPERIMENTAL DATA | PERIOD | CALCULATION TIME |
|---|---|---|
| SINGLE PERIOD | 60.0 | 0.386 |
| SINGLE PERIOD + NOISE | 600.0 | 119 |
| PLURALITY OF PERIODS | 9.0, 60.0 | 31.7 |
| Stagger PULSE | 2400.0 | 46.1 |
| RANDOM COMMUNICATION | 0 | 118 |

Fig. 15

| Src | dst | cmd | model | period | Alert | ID OF CORRESPONDING PACKET (FOR EXAMPLE, time stamp) |
|---|---|---|---|---|---|---|
| fe80::xx:xx:xx | fe80::aa:aa:aa | i-Am | PERIODIC COMMUNICATION | 60 | OUT-OF-PERIOD COMMUNICATION OCCURRENCE | 1,5,100 |
| fe80::yy:yy:yy | fe80::bb:bb:bb | readPropertyMultiple | PERIODIC COMMUNICATION | 10,60 | PERIOD LOSS OCCURRENCE | 3,4,5 |
| fe80::zz:zz:zz | fe80::cc:cc:cc | unconfirmedCOVNotification | NON-PERIODIC COMMUNICATION | 0 | NEW PERIOD OCCURRENCE | ,2,3,4,5,6⋯ |
| fe80::ww:ww:ww | fe80::dd:dd:dd | readPropertyMultiple | PERIODIC + NON-PERIODIC COMMUNICATION | 600 | NEW PERIOD OCCURRENCE | 10,11,12,13,14,15⋯ |

Fig. 27

PULSE TRAIN SIGNAL CYCLE ESTIMATION DEVICE, PULSE TRAIN SIGNAL CYCLE ESTIMATION METHOD, AND PULSE TRAIN SIGNAL CYCLE ESTIMATION PROGRAM

CROSS-REFERENCE TO RELATED APPLICATIONS

The present application is based on PCT filing PCT/JP2020/006627, filed Feb. 19, 2020, which claims priority to JP 2019-029890, filed Feb. 21, 2019, the entire contents of each are incorporated herein by reference.

TECHNICAL FIELD

The present invention relates to a period estimation apparatus for a pulse train signal, a period estimation method for a pulse train signal, and a period estimation program for a pulse train signal.

BACKGROUND ART

Typical methods of estimating a period of a pulse train signal include methods of a differential histogram method in which a histogram indicating a difference between pulse arrival times is created to thereby perform period estimation, sequential search in which correlation with a hypothetical periodic pulse train is calculated, and pulse repetition interval (PRI) conversion in which conversion similar to autocorrelation is performed. These methods each have different pros and cons from the viewpoint of calculation time, tolerance to jitter and loss, and the like. Thus, to complement each of the cons, there is a method of performing period estimation by combining these methods. The method is, specifically, a method of extracting potential candidate periods by using the differential histogram method, and then performing two-step period determination on the candidate period by using the PRI conversion and the sequential search.

CITATION LIST

Non Patent Literature

NPL 1: H. K. Mardia, et al: New Techniques for the Deinterleaving of Repetitive Sequences, Volume 136 issue 4, August 1989, Page 149-154

NPL 2: C. L. Davies, et al: Automatic Processing for ESM, Volume 129 issue 3, June 1982, Page 164-171

NPL 3: KEN'ICHI, N. et al: Improved Algorithm for Estimating Pulse Repetition Intervals, IEEE Transactions on Aerospace and Electronic Systems, Volume 36 issue 2, April 2000, Page 407-421

NPL 4: Yanchao Liu. et al: Improved Method for Deinterleaving Radar Signals and Estimating PRI Values, volume 12 issue 5, 16 Apr. 2018, Page 506-514

SUMMARY OF THE INVENTION

Technical Problem

The existing method is mainly applied to the field of radar pulse analysis in many cases. When the method is applied to the field of a network, problems include two problems. A first problem is a problem of calculation time reduction. In the field of a network, there are more factors that produce random noise as compared to the field of radar pulse analysis. In the existing method, there is a problem that a period that does not actually exist is extracted as a candidate period due to influence of random noise pulses, which results in increase of calculation time. A second problem is a problem related to uneven distribution of pulse receiving timing (jitter). In a network environment, there is an observed tendency that jitter is liable to occur on a delay direction. When the jitter is unevenly distributed on one direction such as the delay direction, influence of the jitter is accumulated in proportion to the length of an observation time period, and thus it may not be able to be determined the periodic pulse as periodic with the existing method. Accordingly, it is difficult to detect a change in a communication period due to configuration alteration of an apparatus in a network environment, and an apparatus that has a period different from that of a plurality of similar apparatuses.

Means for Solving the Problem

In order to solve the problems described above and achieve the object, a period estimation apparatus for a pulse train signal according to the present invention includes processing circuitry configured to extract candidate periods being a target of period determination from an input pulse train, use at least one of the candidate periods extracted to determine whether the at least one of the candidate periods exists as an actual period, and, when determining that the at least one of the candidate periods does not exist as the actual period, suspend the period determination for the at least one of the candidate periods, perform the period determination for the at least one of the candidate periods determined to exist as the actual period, generate a pseudo periodic pulse train based on the at least one of the candidate periods, adjust, based on a differential value between the pseudo periodic pulse train generated and the input pulse train, a pulse position of the pseudo periodic pulse train, and detect a periodic pulse train according to results of the period determination and adjustment, separate the periodic pulse train detected from the input pulse train, and input a separated pulse train as a new input pulse train, and determine whether analysis of a period is to be continued, based on one or more of a parameter related to extraction of the candidate periods and the new input pulse train.

A period estimation method for a pulse train signal according to the present invention is executed by a computer. The period estimation method includes extracting candidate periods being a target of period determination from an input pulse train, using at least one of the candidate periods extracted to determine whether the at least one of the candidate periods exists as an actual period, and, when the at least one of the candidate periods is determined not to exist as the actual period, suspending the period determination for the at least one of the candidate periods, performing the period determination for the at least one of the candidate periods determined to exist as the actual period and detecting a periodic pulse train according to results of the period determination, separating the periodic pulse train detected from the input pulse train, and inputting a separated pulse train as a new input pulse train in the extracting, and determining whether analysis of a period is to be continued, based on one or more of a parameter related to extraction of the candidate periods and the new input pulse train.

A non-transitory computer-readable recording medium storing therein a period estimation program for a pulse train signal according to the present invention causes a computer to execute a process including extracting candidate periods being a target of period determination from an input pulse train, using at least one of the candidate periods extracted to determine whether the at least one of the candidate periods exists as an actual period, and, when the at least one of the candidate periods is determined not to exist as the actual period, suspending the period determination for the at least one of the candidate periods, performing the period determination for the at least one of the candidate periods determined to exist as the actual period and detecting a periodic pulse train according to results of the period determination, separating the periodic pulse train detected from the input pulse train, and inputting a separated pulse train as a new input pulse train in the extracting, and determining whether analysis of a period is to be continued, based on one or more of a parameter related to extraction of the candidate periods and the new input pulse train.

Effects of the Invention

According to the present invention, there is an effect of enabling detection of a change in a communication period due to configuration alteration of an apparatus in a network environment, and an apparatus that has a period different from that of a plurality of similar apparatuses.

BRIEF DESCRIPTION OF DRAWINGS

FIG. 4 is a diagram illustrating an example of clustering of an accumulated differential histogram.

FIG. 10 is a diagram illustrating an example of correction of pulse positions in sequential search.

FIG. 11 is a diagram illustrating an example of correction of pulse positions in sequential search.

FIG. 15 is a diagram illustrating an example of reduction of calculation time.

FIG. 27 is a diagram illustrating an example of detection results of the period estimation apparatus illustrated in FIG. 17.

DESCRIPTION OF EMBODIMENTS

With reference to the drawings, embodiments of a period estimation apparatus for a pulse train signal, a period estimation method for a pulse train signal, and a period estimation program for a pulse train signal disclosed in the present application will be described below in detail. Note that these embodiments do not limit the period estimation apparatus for a pulse train signal, the period estimation method for a pulse train signal, and the period estimation program for a pulse train signal according to the present application.

First Embodiment

The following embodiment will describe a configuration of a period estimation apparatus 10 according to the first embodiment and procedures of processing of the period estimation apparatus 10 in the mentioned order, and will describe effects of the first embodiment at the end.

Figure 1:
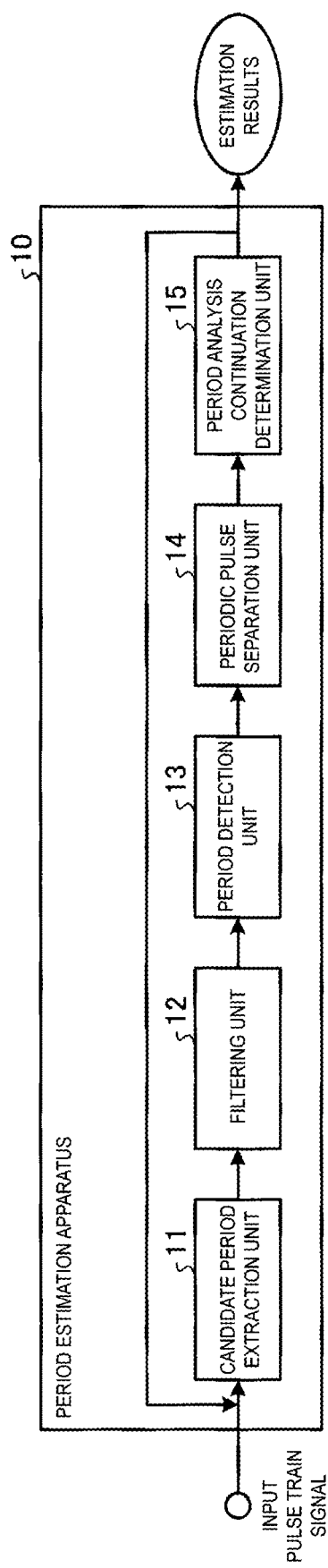
FIG. 1 is a block diagram illustrating an example of a configuration of a period estimation apparatus according to a first embodiment.

Configuration of Period Estimation Apparatus First, with reference to FIG. 1, a configuration of the period estimation apparatus 10 will be described. FIG. 1 is a block diagram illustrating an example of a configuration of the period estimation apparatus according to the first embodiment. The period estimation apparatus 10 extracts candidate periods to be a target of period determination from an input pulse train. The period estimation apparatus 10 uses a part of the extracted candidate periods to determine whether the candidate periods exist as actual periods, and when the period estimation apparatus 10 determines that the candidate periods do not exist as actual periods, the period estimation apparatus 10 suspends period determination for the candidate periods. The period estimation apparatus 10 performs period determination for the candidate periods that are determined to exist as the actual periods, and generates a pseudo periodic pulse train based on the candidate periods.

The period estimation apparatus 10 adjusts pulse positions of the pseudo periodic pulse train, based on a differential value between the generated pseudo periodic pulse train and the input pulse train, and performs detection of a periodic pulse train according to results of the period determination and the adjustment. The period estimation apparatus 10 separates the detected periodic pulse train from the input pulse train, and inputs the separated pulse trains as new input pulse trains to a candidate period extraction unit that extracts the candidate periods. The period estimation apparatus 10 determines whether analysis of the period is to be continued, based on one or more of a parameter related to the extraction of the candidate periods and the new input pulse trains. In this manner, the period estimation apparatus 10 can detect a change in a communication period due to configuration alteration of an apparatus in a network environment, and an apparatus that has a period different from that of a plurality of similar apparatuses.

As illustrated in FIG. 1, the period estimation apparatus 10 includes a candidate period extraction unit 11, a filtering unit 12, a period detection unit 13, a periodic pulse separation unit 14, and a period analysis continuation determination unit 15. The period estimation apparatus 10 includes a storage unit (not illustrated). The storage unit is, for example, implemented by a random access memory (RAM), a semiconductor memory element such as a flash memory, or a storage apparatus such as a hard disk and an optical disc. Note that, in addition to the functional units illustrated in FIG. 1, the period estimation apparatus 10 may include various functional units included in a known computer, for example, functional units such as various input devices and audio output devices.

As illustrated in FIG. 1, the period estimation apparatus 10 receives input of the input pulse train signal. For example, as the input pulse train signal, the period estimation apparatus 10 may acquire a communication log and generate time series data of communication occurrence time. The time series data is data in which a signal representing communication occurrence is represented with pulses, and is also referred to as a time series pulse train or an input pulse train. For example, the time series data is binary data that indicates "1" in a case where there is communication at certain time, and indicates "0" in a case where there is no communication.

Figure 2:
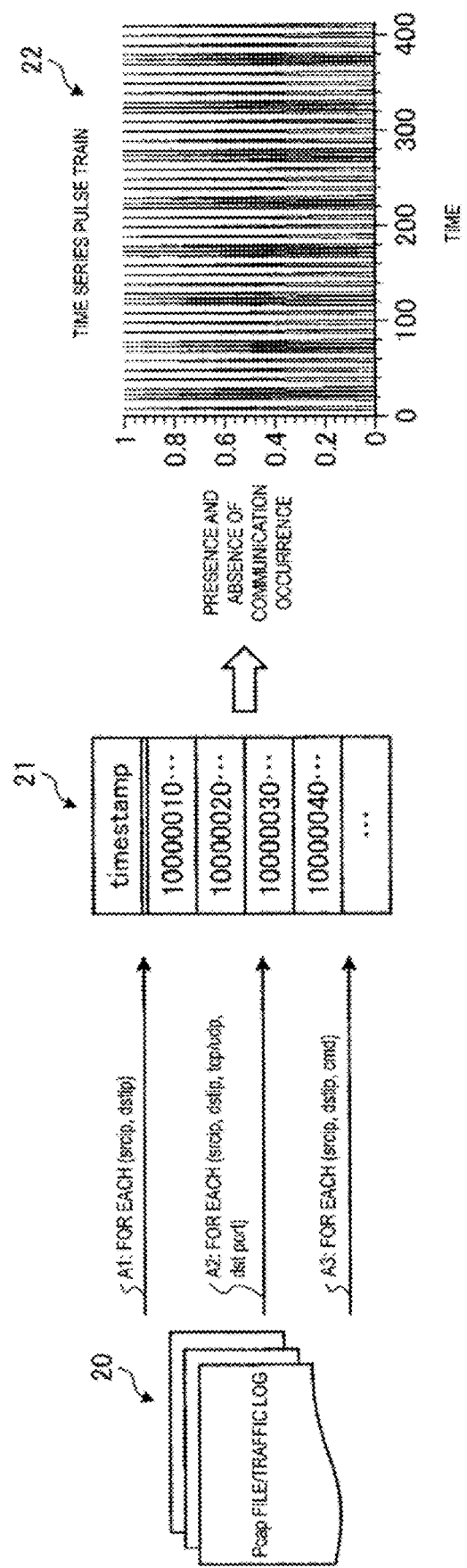
FIG. 2 is a diagram illustrating an example of generation of time series data.

Here, generation of the time series data will be described with reference to FIG. 2. FIG. 2 is a diagram illustrating an example of generation of the time series data. As illustrated in FIG. 2, a communication log 20 includes a Pcap file or a traffic log. The period estimation apparatus 10 generates, for example, the time series data for each combination of (srcip, dstip) indicated in a set A1 of the communication log 20. The period estimation apparatus 10 can generate the time series data from which the period can be more accurately extracted by combining a protocol number, a port number, and a command of each protocol, in addition to the set A1. For example, the period estimation apparatus 10 may generate the time series data for each combination of (srcip, dstip, tcp/udp, dst port) indicated in a set A2 of the log 20 or for each combination of (srcip, dstip, cmd) indicated in a set A3. In this case, accuracy of the extraction is as follows: set A3>set A2>set A1.

The period estimation apparatus 10 generates a timestamp 21, based on the sets A1, A2, and A3. The period estimation apparatus 10 generates time series data (time series pulse train) 22 in which presence and absence of communication occurrence are put in order in time series, based on the generated timestamp 21. The period estimation apparatus 10 can use the generated time series data 22 as the input pulse train signal.

FIG. 1 is referred to again for description. For example, the candidate period extraction unit 11, the filtering unit 12, the period detection unit 13, the periodic pulse separation unit 14, and the period analysis continuation determination unit 15 are implemented when a program stored in an internal storage apparatus is executed by a central processing unit (CPU), a micro processing unit (MPU), or the like by using the RAM as a work area. For example, the candidate period extraction unit 11, the filtering unit 12, the period detection unit 13, the periodic pulse separation unit 14, and the period analysis continuation determination unit 15 may be implemented by an integrated circuit such as an application specific integrated circuit (ASIC) and a field programmable gate array (FPGA). Note that the configurations of the candidate period extraction unit 11, the filtering unit 12, the period detection unit 13, the periodic pulse separation unit 14, and the period analysis continuation determination unit 15 are not limited to the configurations illustrated in FIG. 1, and may be any configuration as long as the configuration is a configuration that performs information processing to be described below.

The candidate period extraction unit 11 extracts candidate periods to be a target of period determination from the input time series data or the generated time series data. The candidate period extraction unit 11 first sets a difference value c to 1. The candidate period extraction unit 11 generates an accumulated differential histogram of the set difference value c. The candidate period extraction unit 11 calculates a difference (pulse repetition interval, hereinafter also referred to as a PRI) of pulse occurrence times of the time series data, based on the difference value c. For example, when the difference value c is 1, the candidate period extraction unit 11 calculates the PRI between adjacent pulses. For the calculation of the PRI, the following expression (1) is used. The candidate period extraction unit 11 creates a histogram of the number of occurrences of the PRI, based on the calculated PRI. In other words, the candidate period extraction unit 11 creates a differential histogram of the time series data.

[Math. 1]

$$D\sin(i) = \sin(i+c) - \sin(i), (1 \le c \le N-c) \quad (1)$$

In expression (1), Sin represents a train of occurrence times of respective pulses. DSin represents a PRI. N represents a total number of pulses in an observation time period. c represents a difference value.

Figure 3:
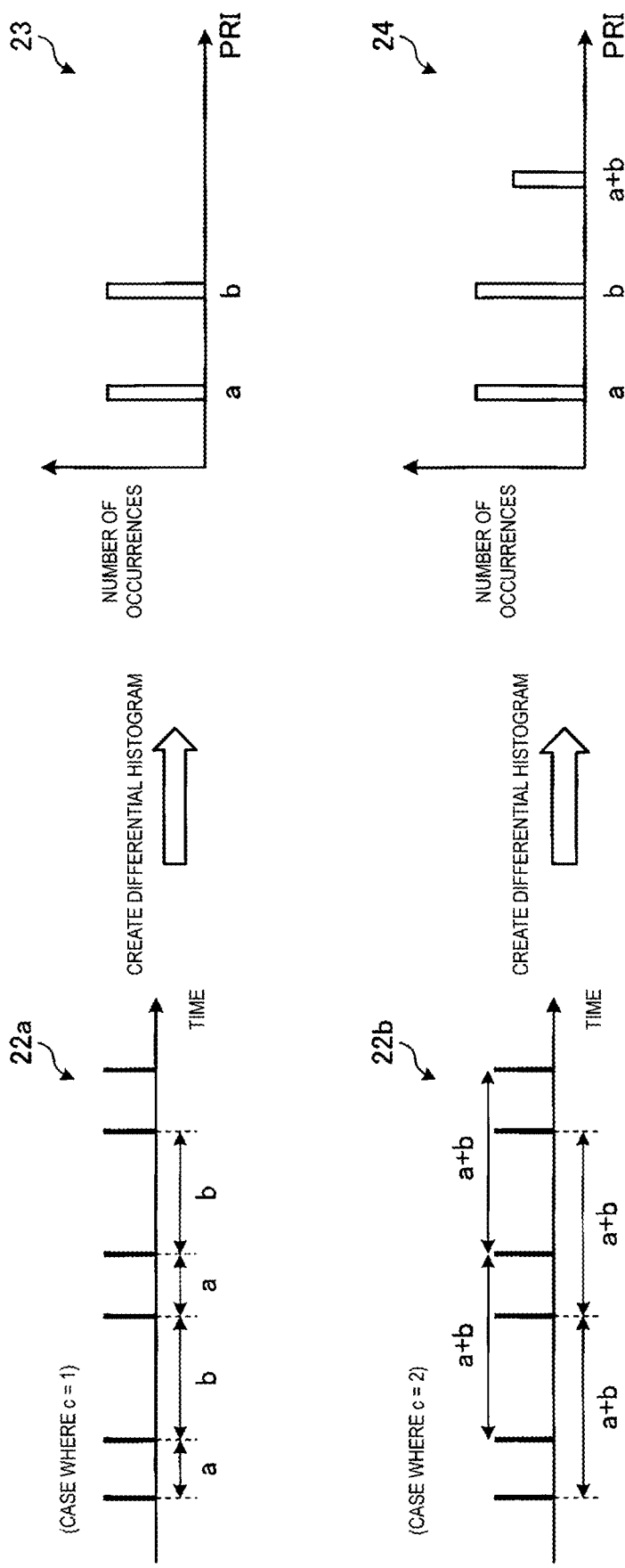
FIG. 3 is a diagram illustrating an example of generation of an accumulated differential histogram.

Here, with reference to FIG. 3, the generation of the accumulated differential histogram will be described. FIG. 3 is a diagram illustrating an example of generation of the accumulated differential histogram. As illustrated in FIG. 3, time series data 22a illustrates the values of the PRI when the difference value c is 1. In the time series data 22a, the number of occurrences of PRI=a and PRI=b is calculated to create a histogram, that is, to create a differential histogram, and a histogram 23 is thereby generated. Time series data 22b illustrates the values of the PRI when the difference value c is 2. Note that the time series data 22b is the same data as the time series data 22a. In the time series data 22b, the number of occurrences of PRI=a+b is calculated and is added to the number of occurrences of PRI=a and PRI=b when the difference value c is 1, and a histogram 24 is thereby generated.

Next, the candidate period extraction unit 11 performs clustering of the generated accumulated differential histogram. The candidate period extraction unit 11 performs the clustering in order to correct jitter, which is a subtle deviation of the PRI being caused due to a packet data acquisition environment in a network. Note that a jitter allowable rate (allowable jitter rate) Jc % at the time of the clustering is set in advance.

Here, the clustering will be described with reference to FIGS. 4 and 5. FIG. 4 is a diagram illustrating an example of clustering of the accumulated differential histogram. As illustrated in FIG. 4, in a histogram 25, there is a variation in the PRI due to jitter, and the number of occurrences does not exceed a threshold, and thus the candidate periods cannot be extracted. In view of this, clustering is performed for the histogram 25 with the jitter allowable rate of Jc %, that is, the varying PRI is aggregated to have the most likely value, to create a histogram 26. As a result of the clustering, the number of occurrences exceeds the threshold, and the candidate periods can be extracted even when there is jitter.

Figure 5:
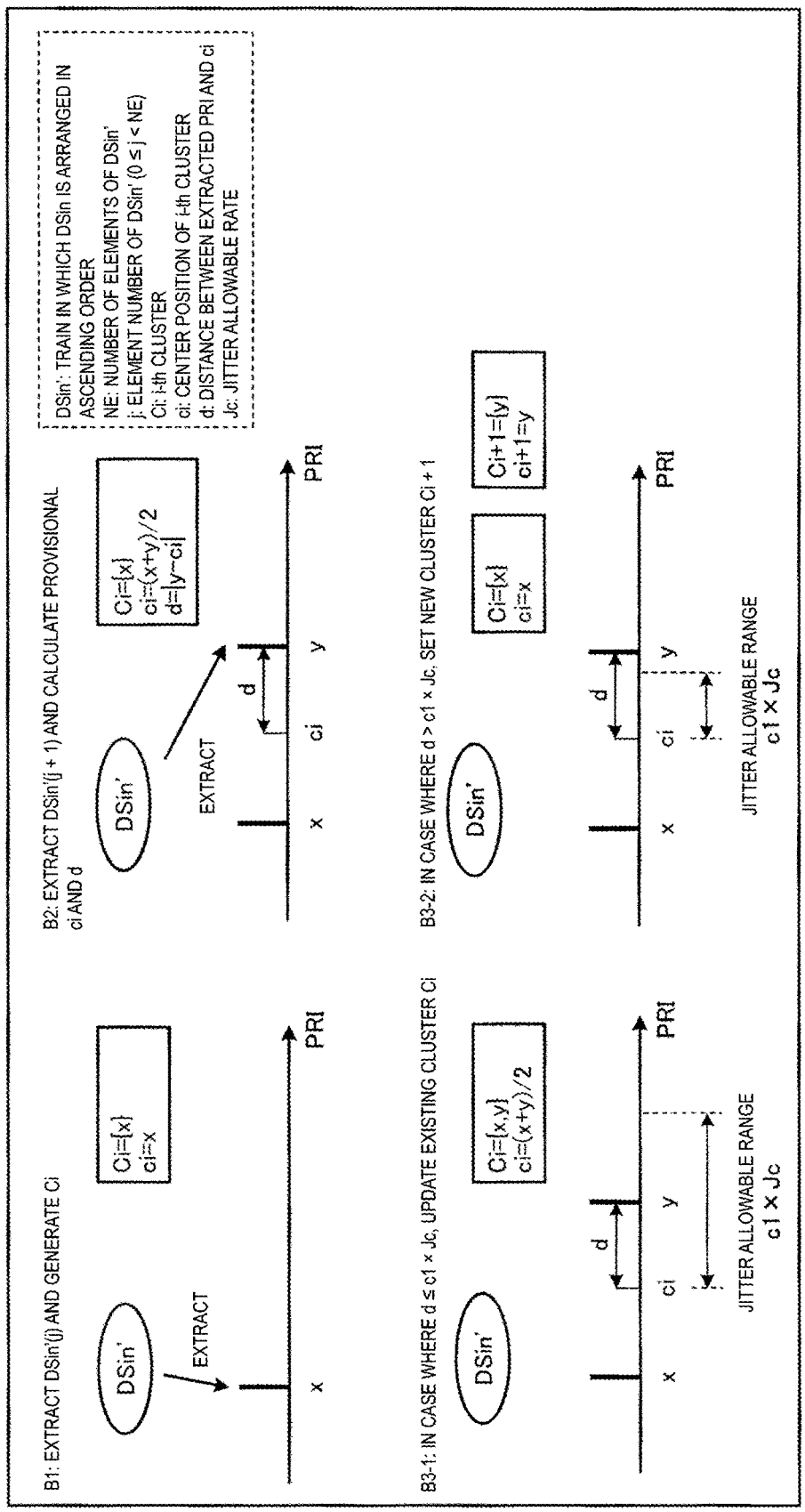
FIG. 5 is a diagram illustrating a detailed example of clustering of an accumulated differential histogram.

FIG. 5 is a diagram illustrating a detailed example of clustering of the accumulated differential histogram. In FIG. 5, DSin represents a train in which calculated PRI values are put in order. DSin' represents a train in which DSin is arranged in ascending order. NE represents the number of elements of DSin'. j represents an element number (0≤j<NE) of DSin'. In FIG. 5, Ci represents an i-th cluster. ci represents a center position of the i-th cluster. d represents a distance between an extracted PRI and ci. Jc represents a jitter allowable rate. x represents the first extracted PRI value. y represents the second extracted PRI value.

As illustrated in FIG. 5, the candidate period extraction unit 11 first rearranges DSin in ascending order to generate DSin'. The candidate period extraction unit 11 extracts DSin'(j) and generates Ci (step B1). The candidate period extraction unit 11 extracts DSin'(j+1), and calculates provisional ci and d (step B2). The candidate period extraction unit 11 performs the calculation by assuming ci=(x+y)/2 and d=|y−ci|, for example.

The candidate period extraction unit 11 determines whether d is equal to or less than an allowable range of jitter (c1×Jc). In a case where the candidate period extraction unit 11 determines that d is equal to or less than the allowable range of jitter (c1×Jc) (step B3-1), the candidate period extraction unit 11 updates the existing cluster Ci. In other words, the cluster Ci includes two PRI values, namely x and y.

On the other hand, in a case where the candidate period extraction unit 11 determines that d exceeds the allowable range of jitter (c1×Jc) (step B3-2), the candidate period extraction unit 11 sets a new cluster Ci+1. In other words, the cluster Ci includes x, and the new cluster Ci+1 includes y. In this manner, the candidate period extraction unit 11 performs the clustering by sequentially extracting the PRI values from DSin' and having the extracted PRI values belong to an existing or new cluster.

Next, the candidate period extraction unit 11 applies a threshold to the histogram regenerated through the clustering, and extracts candidate periods. The candidate period extraction unit 11 outputs the extracted candidate periods to the filtering unit 12. Note that the threshold is set in such a manner that, when a pulse train having a period of a certain PRI value occupies a percentage of ten times ω or more of the entire observation time period T, the PRI is selected as the candidate period. The threshold is obtained according to the following expression (2). Note that, in expression (2), T represents a pulse observation time period, and ω represents a coefficient for threshold determination.

[Math. 2]

$$\text{threshold} = \omega T/\text{PRI} \qquad (2)$$

Figure 6:
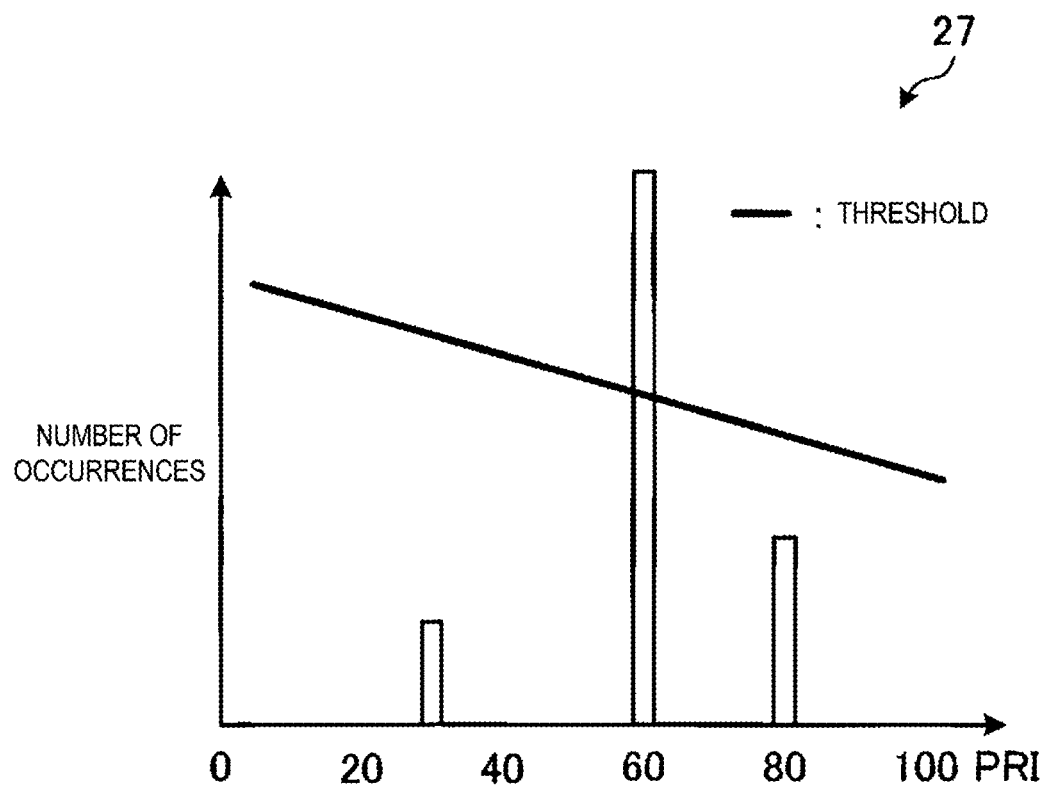
FIG. 6 is a diagram illustrating an example of extraction of a candidate period.

Here, the extraction of the candidate period will be described with reference to FIG. 6. FIG. 6 is a diagram illustrating an example of extraction of the candidate period. A histogram 27 illustrated in FIG. 6 is a histogram that has been subjected to clustering, and it can be seen that the PRI of 60 exceeds a threshold. Thus, the candidate period extraction unit 11 extracts the PRI of 60 as the candidate period.

FIG. 1 is referred to again for description. When the candidate periods are input from the candidate period extraction unit 11, the filtering unit 12 determines whether the input candidate periods exist as actual periods by using random noise filtering and partial sequential search. Note that the filtering unit 12 sequentially performs period determination for the candidate periods extracted in the candidate period extraction unit 11 in ascending order from a candidate period having the smallest value. The filtering unit 12 first executes the random noise filtering. In other words, the filtering unit 12 calculates a theoretical maximum spectrum value at the time of execution of PRI conversion of the input candidate period and a random noise threshold calculated at the time of PRI conversion.

In a case where the random noise threshold is larger than the calculated theoretical maximum spectrum value, the filtering unit 12 suspends analysis of the difference value c and proceeds to analysis of the following difference value c+1. Specifically, when the following expression (3) is satisfied, the filtering unit 12 determines that the candidate period does not exist as an actual period. Note that, in expression (3), T represents an observation time period of the input pulse train. τ represents a value of the candidate period. γ represents a constant. Jc represents an allowable jitter rate.

[Math. 3]

$$\frac{T}{\tau} < \gamma \sqrt{\tau Jc/t} \qquad (3)$$

In a case where the calculated theoretical maximum spectrum value is equal to or larger than the random noise threshold, that is, in a case where the calculated theoretical maximum spectrum value passes the random noise filtering, the filtering unit 12 performs the partial sequential search. First, time series data g(t) and a pseudo periodic pulse train q(t) in the partial sequential search will be described. Note that the pseudo periodic pulse train q(t) is a pulse train having a value τ of the candidate period with a jitter range. The time series data g(t) is expressed by the following expression (4) and expression (5). The pseudo periodic pulse train q(t) is expressed by the following expression (6) and expression (7).

[Math. 4]

$$g(t) = \sum_{n=0}^{N-1} \delta(t - t_n) \qquad (4)$$

-continued

[Math. 5]

$$t_n, (n = 0, \ldots, N-1) \quad (5)$$

[Math. 6]

$$q(t) = \sum_{t=0}^{T} f(t) \quad (6)$$

[Math. 7]

$$f(t) = \begin{cases} 1 & \text{when } p + a\tau - \tau Jc < t < p + a\tau + \tau Jc, \left(0 \le a \le \text{int}\left(\frac{T-p}{\tau}\right)\right) \\ 0 & \text{otherwise} \end{cases} \quad (7)$$

Here, t represents time. N represents a total number of pulses in an observation time period. δ represents the Dirac delta function. $t_n$ represents pulse occurrence time. T represents a pulse observation time period. p represents the position of the first pulse (initial pulse). a represents a constant. τ represents a candidate period. Jc represents a jitter allowable rate.

The filtering unit 12 executes the partial sequential search, in which partial period determination is performed before execution of PRI conversion, in order to reduce calculation time. The filtering unit 12 performs the sequential search by using up to the X-th pulse of the pseudo periodic pulse train q(t), and in a case where a correlation value D between the time series data g(t) and the pseudo periodic pulse train q(t) is X or more, the filtering unit 12 outputs a value τ of the candidate period to the period detection unit 13. Note that the correlation value D is the number of overlapping pulses between the time series data g(t) and the pseudo periodic pulse train q(t), and is expressed by the following expression (8). In expression (8), X is a constant that represents a range of the partial sequential search, and tx represents occurrence time of the X-th pulse.

[Math. 8]

$$D = \sum_{t=0}^{t_x} g(t)q(t) \quad (8)$$

Figure 7:
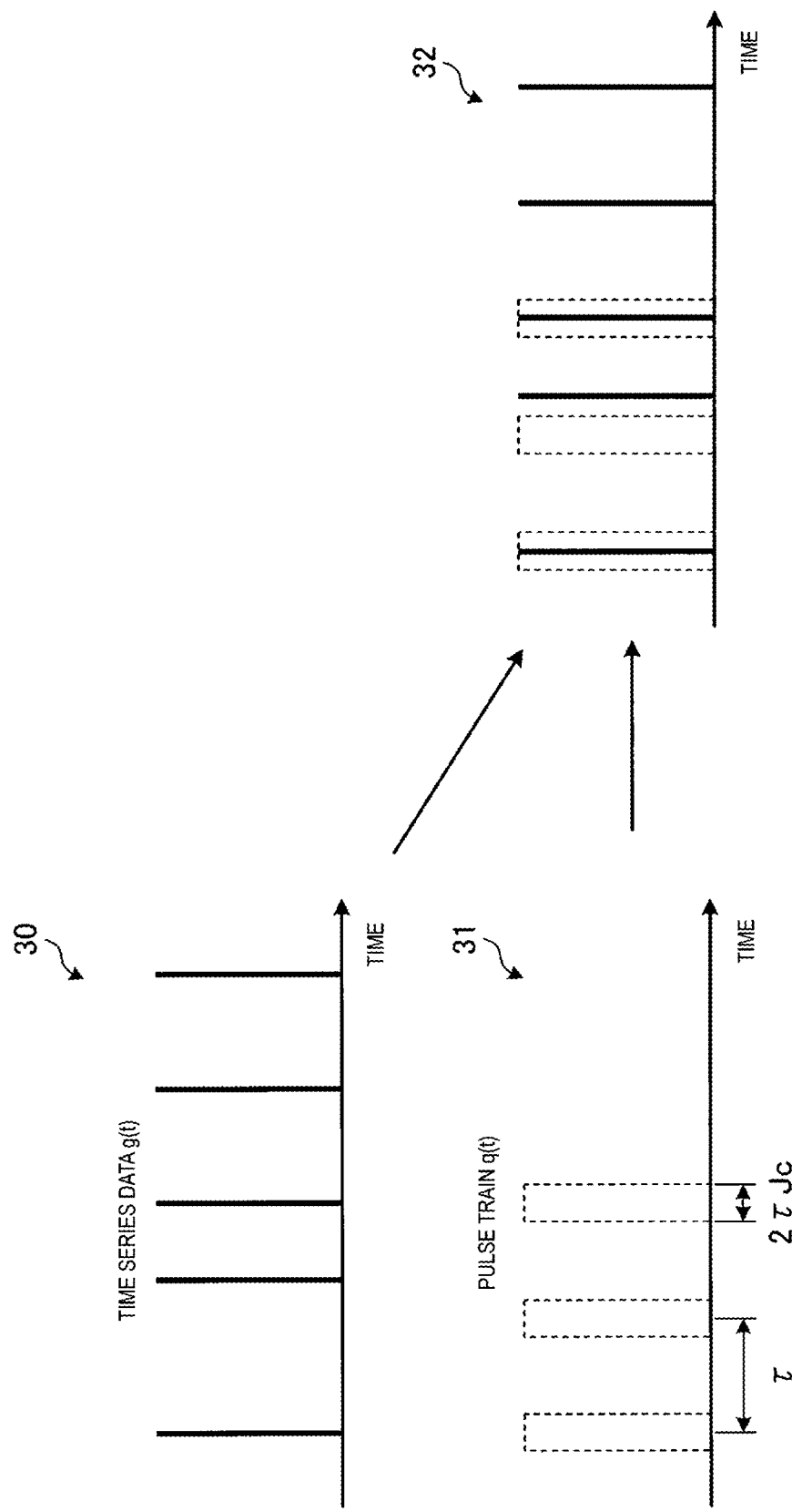
FIG. 7 is a diagram illustrating an example of partial sequential search.

Here, the partial sequential search will be described with reference to FIG. 7. FIG. 7 is a diagram illustrating an example of the partial sequential search. As illustrated in FIG. 7, the filtering unit 12 generates the pseudo periodic pulse train q(t) illustrated in a graph 31 for the time series data g(t) illustrated in a graph 30. In other words, the filtering unit 12 generates the pseudo periodic pulse train q(t) having a total number X of pulses with its pulse width being 2Jcτ, where p represents an initial pulse position, τ represents a pulse interval being a value of a candidate period, and Jc represents an allowable jitter rate. Note that the pseudo periodic pulse train q(t) is intended for correlation calculation of up to the X-th pulse, and thus the values after the X-th pulse are all 0.

As illustrated in the graph 32, when the filtering unit 12 changes time t from 0 to the observation time period T of the time series data g(t) (to tx), the filtering unit 12 counts the number of overlapping pulses (correlation value D) between the pseudo periodic pulse train q(t) and the time series data (input pulse train) g(t). Note that, when a plurality of pulses of the time series data g(t) overlap with one pulse of the pseudo periodic pulse train q(t), the filtering unit 12 sets the count of the number of overlapping pulses to "1". In a case where the number of overlapping pulses (correlation value D) is equal to or larger than the total number X of pulses, the filtering unit 12 determines that there is an actual period, and outputs the value τ of the candidate period to the period detection unit 13.

On the other hand, in a case where the number of overlapping pulses (correlation value D) is smaller than the total number X of pulses, the filtering unit 12 changes the value of a position p of the first pulse and counts the number of overlapping pulses again. In a case where the number of overlapping pulses is smaller than the total number X of pulses with respect to the value of the position p of all of the given first pulses, the filtering unit 12 determines that the candidate period does not exist as an actual period. When the filtering unit 12 determines that the candidate period does not exist as an actual period, the filtering unit 12 suspends analysis of the difference value c, and proceeds to analysis of the following difference value c+1.

FIG. 1 is referred to again for description. When the value τ of the candidate period is input from the filtering unit 12, the period detection unit 13 performs period determination for the value τ of the candidate period in PRI conversion, and performs correction of accumulated jitter. In other words, the period detection unit 13 performs PRI conversion and sequential search for the value τ of the candidate period.

The period detection unit 13 performs calculation of a spectrum and a threshold through PRI conversion by using the following expressions (9) and (10).

[Math. 9]

$$D(\tau) \int g(t)g(t+\tau)e^{\frac{2\pi i t/\tau}{t}} \quad (9)$$

$$dt = \sum_{\tau(1-Jc) < t_n - t_m < \tau(1+Jc)} e^{\frac{2\pi i t_n}{t_n - t_m}}$$

[Math. 10]

$$Th(\tau) = \max\left\{\alpha \frac{T}{\tau}, \beta C(\tau), \gamma N \sqrt{\tau Jc/T}\right\} \quad (10)$$

Note that, in expressions (9) and (10), D(τ) represents a spectrum of the value ti of the candidate period. τ represents an imaginary number. $t_n$ represents occurrence time of the n-th pulse. $t_m$ represents occurrence time of the m-th pulse. Th(τ) represents a threshold of the value τ of the candidate period. α, β, and γ each represent a constant. C(τ) represents an autocorrelation value. N represents a total number of pulses in an observation time period. In expression (9), influence of pulse loss is reduced by adding a term e^(2πit/τ) of phase to an autocorrelation function. Further, when the following expression (11) is satisfied during execution of the PRI conversion, the period detection unit 13 suspends the PRI conversion and proceeds to analysis of the following difference value c+1.

[Math. 11]

$$Dn+(T-ToAn)/\tau < Th \quad (11)$$

Note that, in expression (11), Dn represents a spectrum of PRI conversion when analysis is performed up to the n-th pulse. T represents an observation time period of the input pulse train. TOAn represents occurrence time of the n-th pulse. τ represents a value of the candidate period. Th represents a threshold of period determination.

Figure 8:
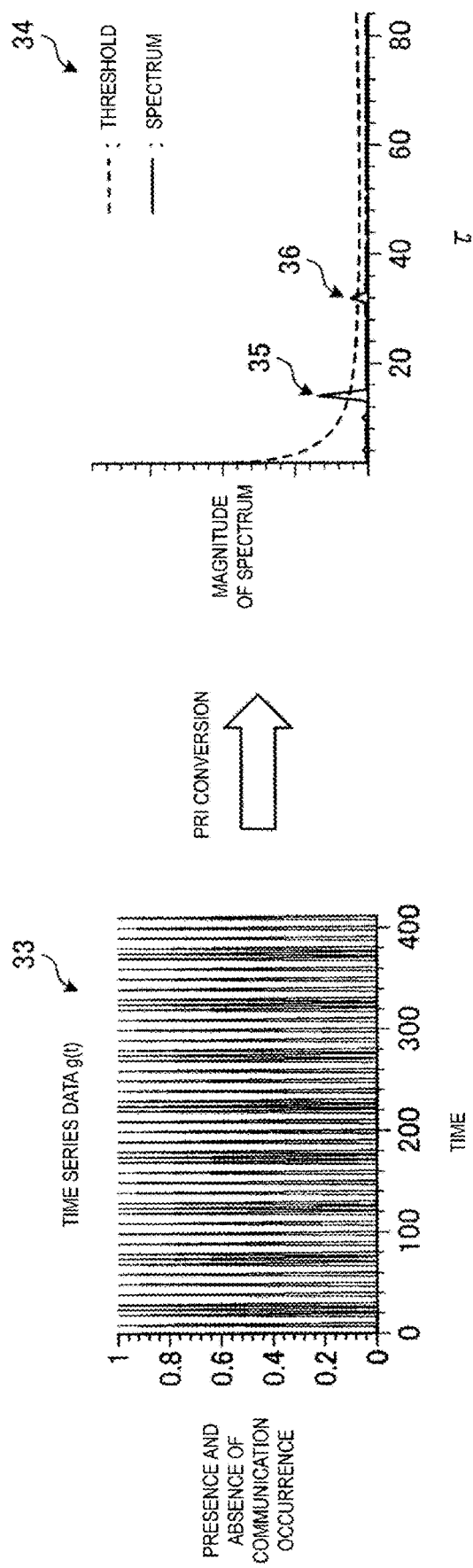
FIG. 8 is a diagram illustrating an example of PRI conversion.

Here, the PRI conversion will be described with reference to FIG. 8. FIG. 8 is a diagram illustrating an example of PRI conversion. When PRI conversion is performed for the time series data g(t) illustrated in a graph 33 of FIG. 8, a graph 34 can be obtained. In the graph 34, for example, candidate periods 35 and 36 exceed a threshold, and thus it can be determined that there is a period.

The period detection unit 13 also performs correction of accumulated jitter when the period detection unit 13 performs the sequential search for the value τ of the candidate period that is determined to have a period in the PRI conversion. In other words, the period detection unit 13 performs extraction of a correct period by reducing influence of jitter caused due to prolongation of the pulse observation time period and influence of a noise pulse that cannot be fully handled with the PRI conversion.

The period detection unit 13 generates a pseudo periodic pulse train q(t) based on the value τ of the candidate period. The period detection unit 13 executes the sequential search by performing correction of the accumulated jitter for the generated pseudo periodic pulse train q(t). The period detection unit 13 calculates the correlation value D between the pseudo periodic pulse train q(t) and the time series data g(t) and compares the calculated correlation value D with a threshold th, and thereby determines whether the value τ of the candidate period exists in the time series data g(t). In a case where the correlation value D is equal to or more than the threshold th, the period detection unit 13 outputs, to the periodic pulse separation unit 14, the pseudo periodic pulse train q(t) as a detected periodic pulse train. Note that the threshold th is represented in the following expression (12). In expression (12), s represents a constant. The correlation value D is the number of overlapping pulses between the time series data g(t) and the pseudo periodic pulse train q(t), and is expressed by the following expression (13).

[Math. 12]

$$th = sT/\tau \qquad (12)$$

[Math. 13]

$$D = \sum_{t=0}^{T} g(t)q(t) \qquad (13)$$

Figure 9:
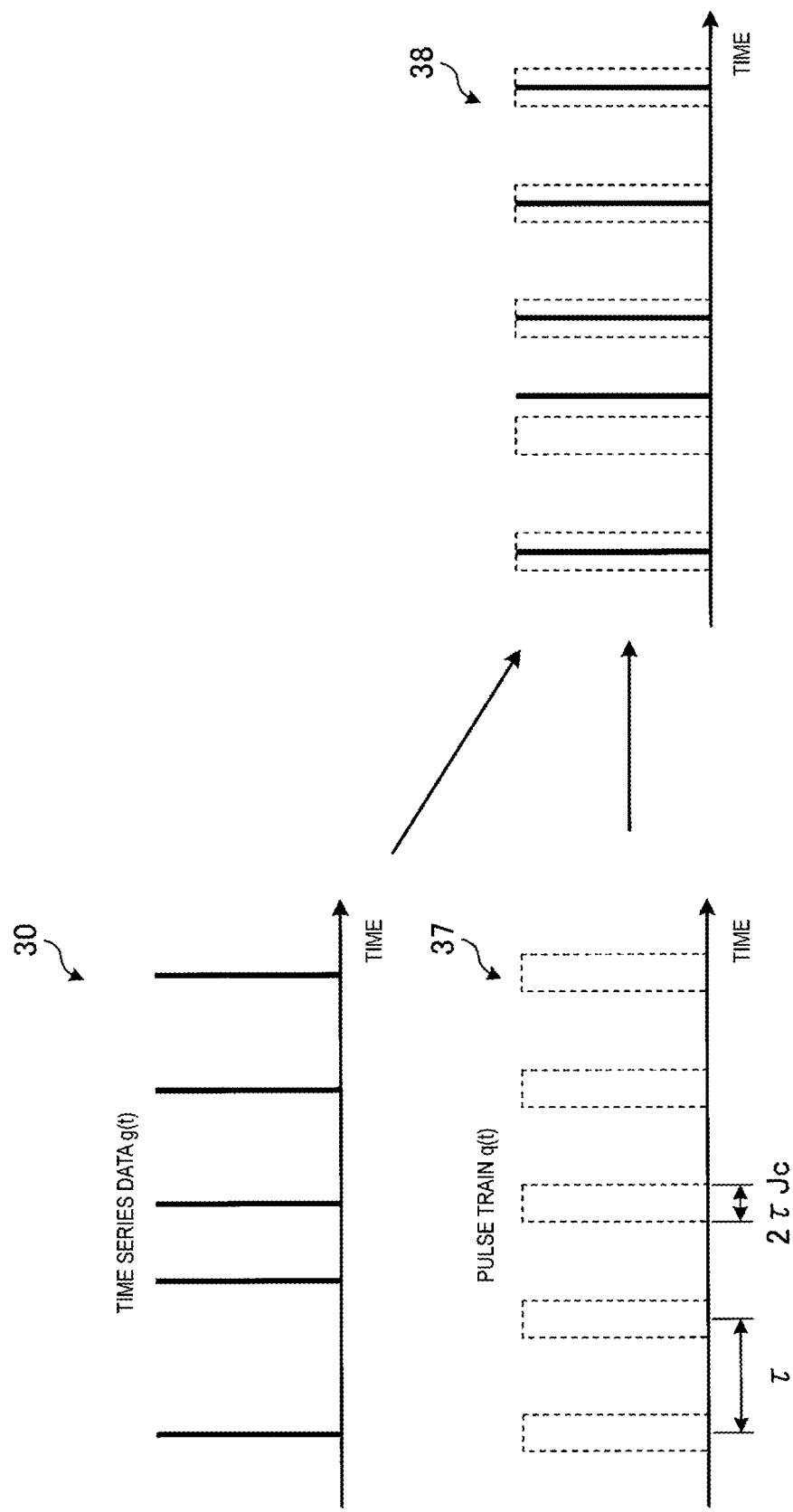
FIG. 9 is a diagram illustrating an example of sequential search.

Here, the sequential search will be described with reference to FIG. 9. FIG. 9 is a diagram illustrating an example of the sequential search. As illustrated in FIG. 9, the period detection unit 13 generates the pseudo periodic pulse train q(t) illustrated in a graph 37 for the time series data g(t) illustrated in the graph 30. In other words, the period detection unit 13 generates the pseudo periodic pulse train q(t) with its pulse width being 2Jcτ, where p represents an initial pulse position, τ represents a value of a candidate period being a pulse interval, and Jc represents an allowable jitter rate.

As illustrated in a graph 38, when the pseudo periodic pulse train q(t) and the time series data g(t) overlap with each other and the period detection unit 13 changes time t from 0 to the observation time period T of the time series data g(t), the period detection unit 13 counts the number of overlapping pulses. Note that, when a plurality of pulses of the time series data g(t) overlap with one pulse of the pseudo periodic pulse train q(t), the period detection unit 13 sets the count of the number of overlapping pulses to "1". In a case where the final number of overlapping pulses (correlation value D) is equal to or more than the threshold th, the period detection unit 13 outputs, to the periodic pulse separation unit 14, the pseudo periodic pulse train q(t) based on the value τ of the candidate period as a detected periodic pulse train.

On the other hand, in a case where the final number of overlapping pulses (correlation value D) is smaller than the threshold th, the period detection unit 13 changes the value of the position p of the first pulse (initial pulse) and counts the number of overlapping pulses again. In a case where the number of overlapping pulses is smaller than the threshold th with respect to the value of the position p of all of the given first pulses, the period detection unit 13 determines that the value τ of the candidate period does not exist as an actual period. In a case where the period detection unit 13 determines that the value τ of the candidate period does not exist as an actual period, the period detection unit 13 proceeds to processing for the value τ of the rest of the candidate periods. In a case where the period detection unit 13 determines that none of the values of the candidate periods as a detection target exists as an actual period, the period detection unit 13 proceeds to analysis of the following difference value c+1.

Next, the correction of the accumulated jitter will be described. As the pulse observation time period is longer, the jitter is accumulated more, and there is a higher probability that the jitter exceeds an allowable jitter range. In a network environment, there is a tendency that more jitter is unevenly distributed on a delay direction, which may easily increase influence of the accumulated jitter. Thus, in the period detection unit 13, jitter correction is performed for each occurrence of a pulse.

FIGS. 10 and 11 are each a diagram illustrating an example of correction of pulse positions in the sequential search. As illustrated in a graph 39 of FIG. 10, in the existing sequential search, as the jitter is accumulated, the pulse position of the time series data g(t) exceeds the allowable jitter range. In this regard, as illustrated in a graph 40, in the sequential search according to the present embodiment, the accumulated jitter is addressed by correcting the pulse positions of the pseudo periodic pulse train q(t) in accordance with a jitter amount of each occurrence of a pulse.

In the graph 40, the second pulse is shifted (moved in parallel) by jitter J1 of the first pulse. The third pulse is shifted by a value that is obtained by adding jitter J2 of the second pulse to jitter J1. In other words, provided that a shift amount for the n-th pulse is represented by a movement value δn, the period detection unit 13 calculates a differential value δn', which is obtained by subtracting the center position of the overlapping pulse of the pseudo periodic pulse train q(t) from the position of the overlapping pulse of the time series data g(t). Next, the period detection unit 13 calculates the movement value δn, based on the calculated differential value δn' and a movement value δn−1 being an immediately preceding differential value of the differential value δn'. The period detection unit 13 moves a subsequent pulse position of the overlapping pulse of an immediately preceding pseudo periodic pulse train q(t) by the movement value δn in parallel.

As illustrated in a graph 41 of FIG. 11, when a plurality of pulses of the time series data g(t) match one pulse of the pseudo periodic pulse train q(t), the period detection unit 13 corrects the pulse position of the pseudo periodic pulse train q(t), by regarding a periodic pulse having the least jitter amount as the periodic pulse. As illustrated in a graph 42, when there is no pulse of the time series data g(t) that matches one pulse of the pseudo periodic pulse train q(t), the period detection unit 13 does not perform the correction of the pulse position of the pseudo periodic pulse train q(t).

Figure 12:
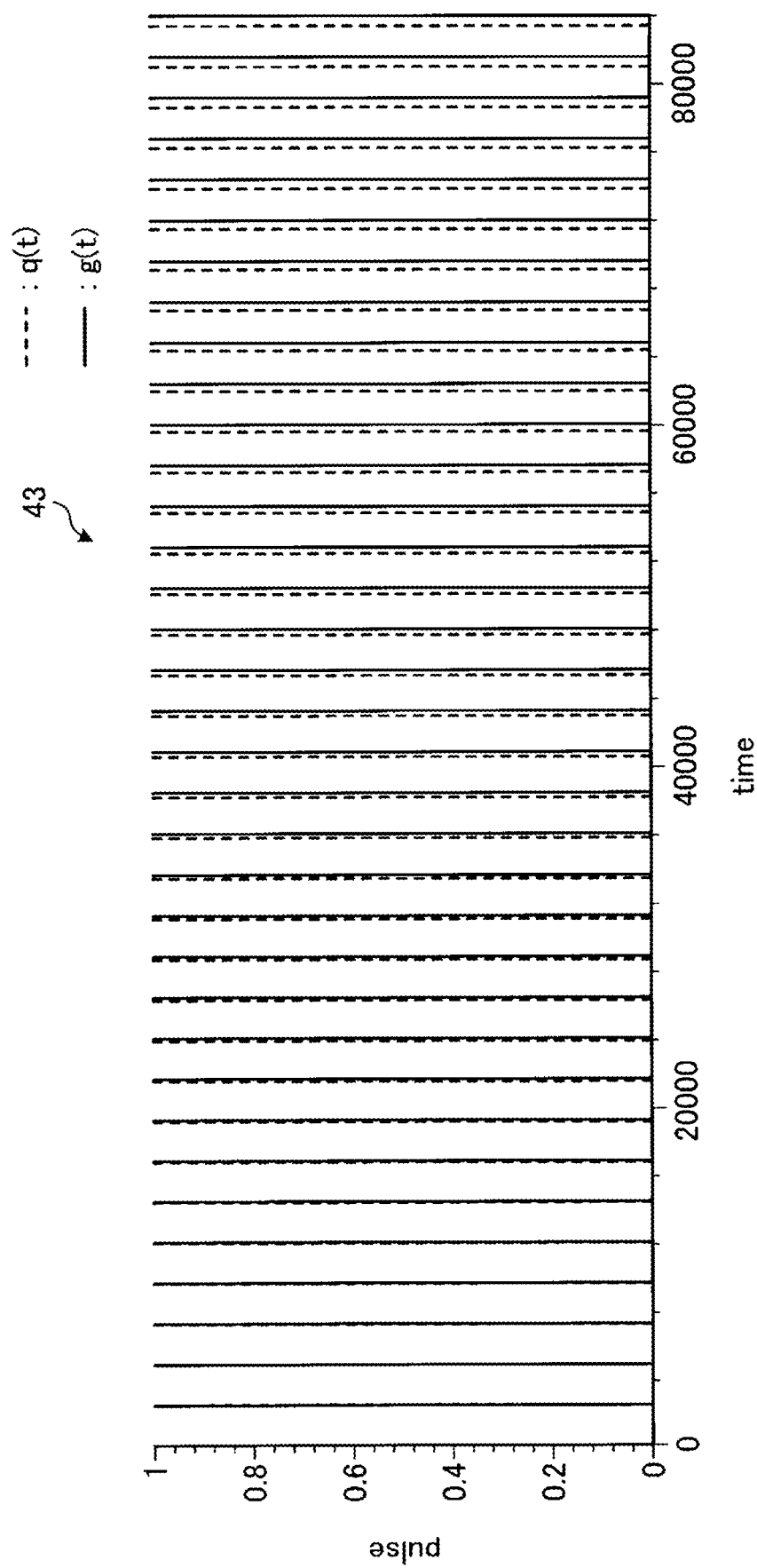
FIG. 12 is a diagram illustrating an example of accumulated jitter.

FIG. 12 is a diagram illustrating an example of the accumulated jitter. A graph 43 illustrated in FIG. 12 is an example of the accumulated jitter observed in communication of a network of a certain building. The graph 43 is an example of a case in which bacnet is used as the analysis target protocol and data of the analysis target has one pattern regarding one day worth of Pcap in a network. In the graph 43, it can be seen that deviation of the pseudo periodic pulse train q(t) is increased due to the influence of the accumulated jitter as the observation time period is longer with respect the time series data g(t) having the period of 2400 seconds. In the example of the graph 43, it is determined that there is no period in the existing sequential search, whereas it is determined that there is a period in the sequential search according to the present embodiment.

FIG. 1 is referred to again for description. When the pseudo periodic pulse train q(t) being a detected periodic pulse train is input from the period detection unit 13, the periodic pulse separation unit 14 separates, from the time series data g(t), pulses that match the pseudo periodic pulse train q(t) from the time series data g(t) as periodic communication. The periodic pulse separation unit 14 outputs, to the period analysis continuation determination unit 15, the separated periodic communication and the time series data g(t) after the periodic communication separation. The periodic pulse separation unit 14 outputs, to the candidate period extraction unit 11, the time series data g(t) after the periodic communication separation.

Figure 13:
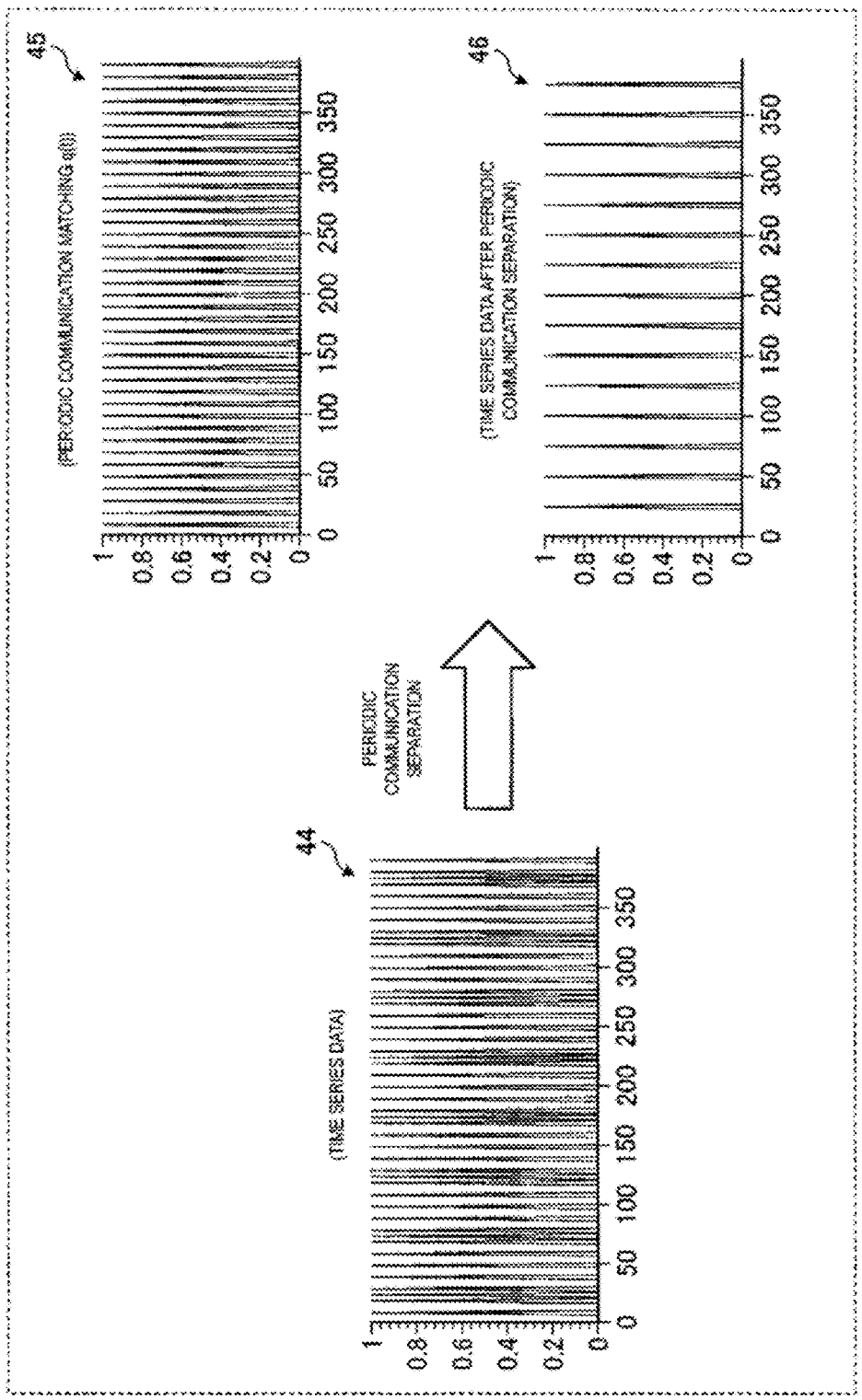
FIG. 13 is a diagram illustrating an example of separation of periodic communication.

FIG. 13 is a diagram illustrating an example of the separation of the periodic communication. As illustrated in FIG. 13, the periodic pulse separation unit 14 separates, from time series data 44, periodic communication 45 that matches the pseudo periodic pulse train q(t). Time series data 46 represents the time series data obtained after the periodic communication 45 is separated from the time series data 44.

FIG. 1 is referred to again for description. When the periodic communication and the time series data g(t) after the periodic communication separation are input from the periodic pulse separation unit 14, the period analysis continuation determination unit 15 determines whether analysis is to be continued based on a determination condition. Here, the determination condition for ending the analysis is a case in which one or more conditions are satisfied out of a case in which the value of the difference value c reaches an upper limit value $c_{limit}$ and period determination for all of the candidate periods has finished and a case in which the number of pulses of the time series data g(t) after the periodic communication separation is equal to or less than a threshold. When none of these conditions is satisfied, the period analysis continuation determination unit 15 determines that the analysis is to be continued. Note that the difference value c is an example of a parameter related to extraction of the candidate periods, and the time series data g(t) after the periodic communication separation is an example of a new input pulse train.

In a case where the period analysis continuation determination unit 15 determines that the analysis is to be continued, the period analysis continuation determination unit 15 instructs the candidate period extraction unit 11 to perform extraction of the candidate periods by using the time series data g(t) after the periodic communication separation. In a case where the period analysis continuation determination unit 15 determines that the analysis is not to be continued, the period analysis continuation determination unit 15 outputs the periodic communication as estimation results, and ends the processing.

Figure 14:
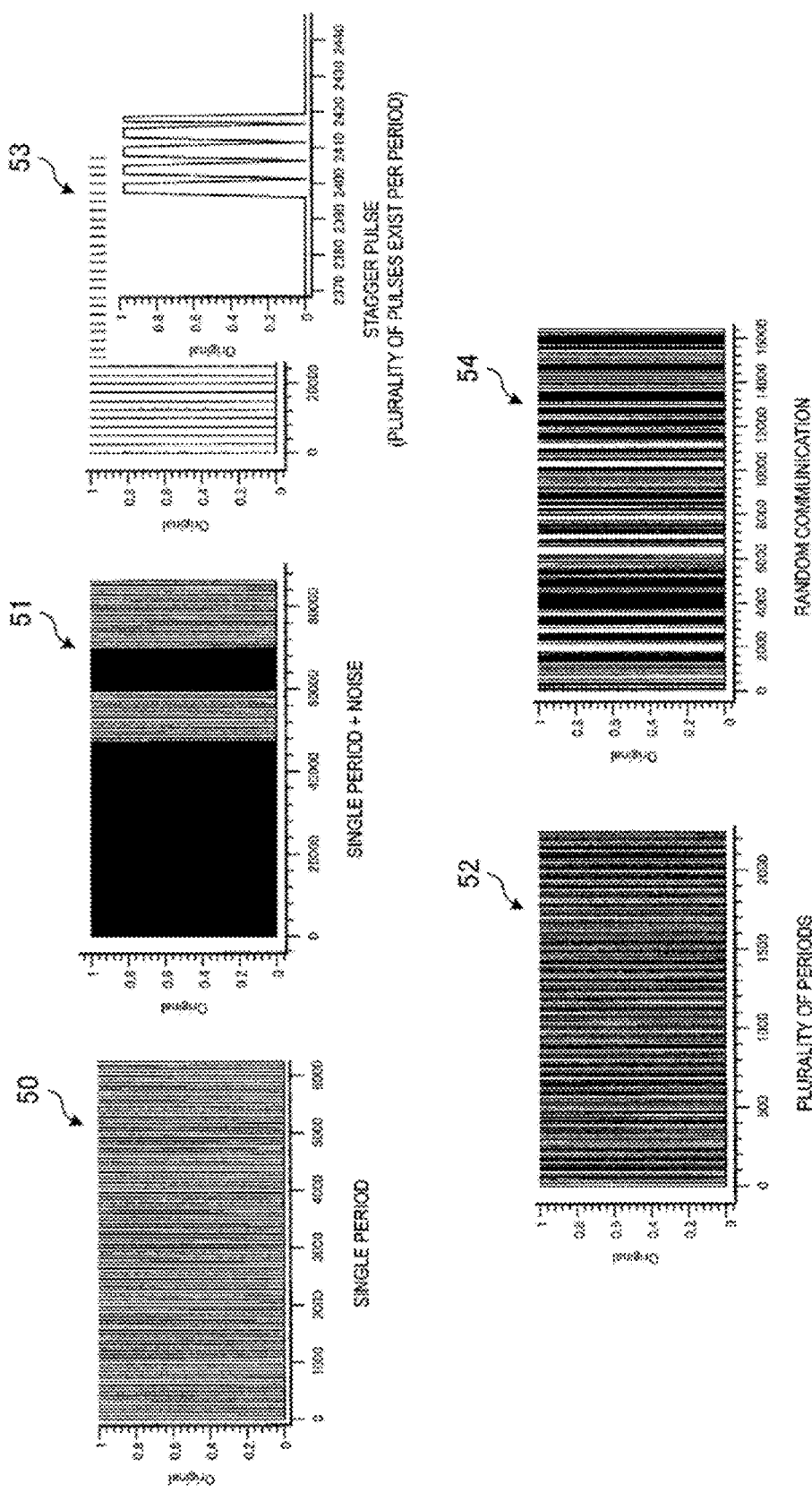
FIG. 14 is a diagram illustrating an example of various pieces of experimental data.

Here, the effect of reduction of the calculation time will be described with reference to FIGS. 14 and 15. FIG. 14 is a diagram illustrating an example of various pieces of experimental data. As experimental data for confirming the effect of reduction of the calculation time, FIG. 14 illustrates experimental data in which bacnet is the analysis target protocol and data of the analysis target has five patterns of experimental data 50 to 54 regarding one day worth of Pcap of a network of a certain building. The experimental data 50 represents data of a single period. The experimental data 51 represents data obtained by adding noise to a single period. The experimental data 52 represents data of a plurality of periods. The experimental data 53 represents data of a stagger pulse, that is, data in which a plurality of pulses exist per period. The experimental data 54 represents random data.

FIG. 15 is a diagram illustrating an example of reduction of the calculation time. Calculation results 55 of FIG. 15 represent calculation results of a case in which an existing method is used. Calculation results 56 represent calculation results according to the present embodiment. In the calculation results 55, when noise was added to a single period of the experimental data 51, erroneous detection of the period occurred. On the other hand, in the calculation results 56, erroneous detection of the period did not occur. When the calculation results 55 and the calculation results 56 are compared to each other, it can be seen that more calculation time is reduced as more noise exists.

Processing Procedure of Period Estimation Apparatus

Figure 16:
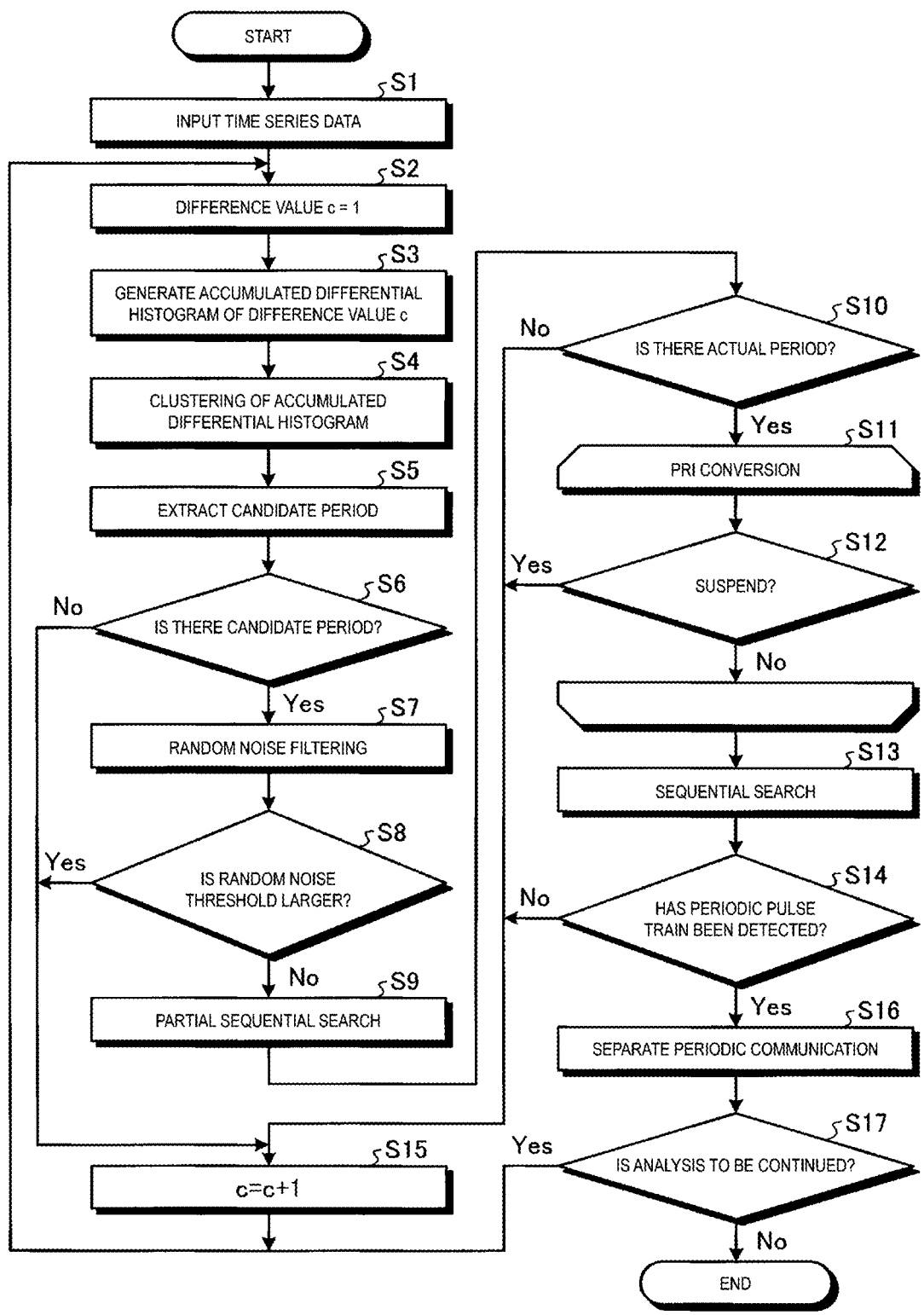
FIG. 16 is a flowchart illustrating an example of period estimation processing according to the first embodiment.

Next, operation of the period estimation apparatus 10 according to the first embodiment will be described. FIG. 16 is a flowchart illustrating an example of period estimation processing according to the first embodiment.

The candidate period extraction unit 11 receives input of time series data as an input pulse train signal (Step S1). The candidate period extraction unit 11 sets the difference value c to 1 (Step S2). The candidate period extraction unit 11 generates an accumulated differential histogram of the set difference value c (Step S3). The candidate period extraction unit 11 performs clustering for the generated accumulated differential histogram (Step S4).

The candidate period extraction unit 11 applies a threshold to the regenerated histogram through the clustering, and extracts candidate periods (Step S5). The candidate period extraction unit 11 determines whether there are successfully extracted candidate periods (Step S6). In a case where the candidate period extraction unit 11 determines that there are no successfully extracted candidate periods (Step S6: No), the candidate period extraction unit 11 increments the difference value c (Step S15), and the processing returns to Step S2. On the other hand, in a case where the candidate period extraction unit 11 determines that there are successfully extracted candidate periods (Step S6: Yes), the candidate period extraction unit 11 outputs the extracted candidate periods to the filtering unit 12.

When the candidate periods are input from the candidate period extraction unit 11, the filtering unit 12 executes random noise filtering (Step S7). The filtering unit 12 determines whether the random noise threshold is larger than the theoretical maximum spectrum value, based on execution results of the random noise filtering (Step S8). In a case where the filtering unit 12 determines that the random noise threshold is larger (Step S8: Yes), the filtering unit 12 increments the difference value c (Step S15), and the processing returns to Step S2. On the other hand, in a case where the filtering unit 12 determines that the theoretical maximum spectrum value is equal to or larger than the random noise threshold (Step S8: No), the filtering unit 12 executes partial sequential search (Step S9).

The filtering unit 12 determines whether there is an actual period, based on the partial sequential search (Step S10). In a case where the filtering unit 12 determines that there is no actual period (Step S10: No), the filtering unit 12 increments the difference value c (Step S15), and the processing returns to Step S2. On the other hand, in a case where the filtering unit 12 determines that there is an actual period (Step S10: Yes), the filtering unit 12 outputs the value of the candidate period to the period detection unit 13.

When the value $\tau$ of the candidate period is input from the filtering unit 12, the period detection unit 13 executes PRI conversion for the value ti of the candidate period (Step S11). During the execution of the PRI conversion, the period detection unit 13 determines whether the PRI conversion is to be suspended, based on expression (11) (Step S12). In a case where the period detection unit 13 determines that the PRI conversion is to be suspended (Step S12: Yes), the period detection unit 13 increments the difference value c (Step S15), and the processing returns to Step S2. On the other hand, in a case where the period detection unit 13 determines that the PRI conversion is not to be suspended (Step S12: No), the period detection unit 13 continuously executes the PRI conversion.

The period detection unit 13 generates a pseudo periodic pulse train q(t) based on the value $\tau$ of the candidate period, regarding the value $\tau$ of the candidate period that is determined to have a period in the PRI conversion. The period detection unit 13 executes sequential search by performing correction of the accumulated jitter for the generated pseudo periodic pulse train q(t) (Step S13). As a result of the sequential search, the period detection unit 13 determines whether a periodic pulse train has been detected (Step S14). In a case where the period detection unit 13 determines that the periodic pulse train has not been detected (Step S14: No), the period detection unit 13 increments the difference value c (Step S15), and the processing returns to Step S2. In a case where the period detection unit 13 determines that the periodic pulse train has been detected (Step S14: Yes), the period detection unit 13 outputs the detected periodic pulse train to the periodic pulse separation unit 14.

When the pseudo periodic pulse train q(t) being the detected periodic pulse train is input from the period detection unit 13, the periodic pulse separation unit 14 separates, from the time series data g(t), pulses that match the pseudo periodic pulse train q(t) from the time series data g(t) as periodic communication (Step S16). The periodic pulse separation unit 14 outputs, to the period analysis continuation determination unit 15, the separated periodic communication and the time series data g(t) after the periodic communication separation. The periodic pulse separation unit 14 outputs, to the candidate period extraction unit 11, the time series data g(t) after the periodic communication separation.

When the periodic communication and the time series data g(t) after the periodic communication separation are input from the periodic pulse separation unit 14, the period analysis continuation determination unit 15 determines whether analysis is to be continued based on a determination condition (Step S17). In a case where the period analysis continuation determination unit 15 determines that the analysis is to be continued (Step S17: Yes), the processing returns to Step S2. On the other hand, in a case where the period analysis continuation determination unit 15 determines that the analysis is not to be continued (Step S17: No), the period analysis continuation determination unit 15 outputs the periodic communication as estimation results, and ends the period estimation processing. In this manner, the period estimation apparatus 10 can detect a change in a communication period due to configuration alteration of an apparatus in a network environment, and an apparatus that has a period different from that of a plurality of similar apparatuses. Because the period estimation apparatus 10 can detect a change in a communication period and an apparatus having a different period, the period estimation apparatus 10 can identify an unintended apparatus configuration.

Effects of First Embodiment As described above, in the period estimation apparatus 10, the candidate period extraction unit 11 extracts the candidate periods being a target of period determination from the input pulse train. The period estimation apparatus 10 uses a part of the extracted candidate periods to determine whether the candidate period exists as an actual period, and when the period estimation apparatus 10 determines that the candidate period does not exist as the actual period, suspends the period determination for the candidate period. The period estimation apparatus 10 performs the period determination for the candidate period determined to exist as the actual period, and generates a pseudo periodic pulse train based on the candidate period. The period estimation apparatus 10 adjusts a pulse position of the pseudo periodic pulse train, based on a differential value between the generated pseudo periodic pulse train and the input pulse train, and performs detection of a periodic pulse train according to results of the period determination and the adjustment. The period estimation apparatus 10 separates the detected periodic pulse train from the input pulse train, and inputs separated pulse trains as new input pulse trains to the candidate period extraction unit 11. The period estimation apparatus 10 determines whether analysis of a period is to be continued based on one or more of a parameter related to the extraction of the candidate periods and the new input pulse trains. As a result, the period estimation apparatus 10 can detect a change in a communication period due to configuration alteration of an apparatus in a network environment, and an apparatus that has a period different from that of a plurality of similar apparatuses.

The period estimation apparatus 10 generates a histogram by calculating each pulse interval of the input pulse train based on a specific difference, and in the generated histogram, extracts pulse interval that occurs a number of times equal to or larger than a predetermined threshold as the candidate period. As a result, the period estimation apparatus 10 can extract the candidate periods.

When the above expression (3) is satisfied, the period estimation apparatus 10 determines that the candidate period does not exist as the actual period. As a result, the period estimation apparatus 10 can reduce calculation time for the PRI conversion or the like.

The period estimation apparatus 10 generates the pseudo periodic pulse train q(t) having a total number X of pulses with its pulse width being $2Jc\tau$, where p represents the initial pulse position, $\tau$ represents the value of the candidate period being the pulse interval, and Jc represents the allowable jitter rate. When g(t) represents the input pulse train and the time t is changed from 0 to the observation time period T of the input pulse train g(t), the period estimation apparatus 10 counts the number of overlapping pulses between the pseudo periodic pulse train q(t) and the input pulse train g(t). When the number of overlapping pulses is equal to or larger than the total number X of pulses, the period estimation apparatus 10 outputs the value τ of the candidate period to the period detection unit 13. When the number of overlapping pulses is smaller than the total number X of pulses, the period estimation apparatus 10 changes the value of p and counts the number of overlapping pulses again, and when the number of overlapping pulses falls below the total number X of pulses with respect to all the given values of p, the period estimation apparatus 10 determines that the candidate period does not exist as the actual period. As a result, the period estimation apparatus 10 can reduce calculation time for the PRI conversion or the like.

In the period determination, when the above expression (11) is satisfied during execution of the PRI conversion, the period estimation apparatus 10 suspends the PRI conversion. As a result, the period estimation apparatus 10 can reduce calculation time for the PRI conversion or the like.

The period estimation apparatus 10 generates the pseudo periodic pulse train q(t) with its pulse width being 2Jcτ, where p represents the initial pulse position, τ represents the pulse interval being the value of the candidate period input from the filtering unit 12, and the Jc represents the allowable jitter rate. When g(t) represents the input pulse train, the time t is changed from 0 to the observation time period T of the input pulse train g(t), and the pseudo periodic pulse train q(t) and the input pulse train g(t) overlap, the period estimation apparatus 10 counts the number of overlapping pulses. The period estimation apparatus 10 counts the number of overlapping pulses, and regarding the overlapping pulses, the period estimation apparatus 10 calculates the differential value δn' obtained by subtracting the center position of the overlapping pulse of the pseudo periodic pulse train q(t) from the position of the overlapping pulse of the input pulse train g(t). The period estimation apparatus 10 calculates the movement value δn, based on the calculated differential value δn' and the movement value δn−1 immediately preceding the differential value δn', and moves the subsequent pulse position of the overlapping pulse of the immediately preceding pseudo periodic pulse train q(t) by the movement value δn in parallel. When the final number of overlapping pulses is equal to or larger than a predetermined value, the period estimation apparatus 10 performs detection of the periodic pulse train based on the value τ of the input candidate period, and when the final number of overlapping pulses is smaller than the predetermined value, the period estimation apparatus 10 changes the value of p and counts the number of overlapping pulses again. When the number of overlapping pulses falls below the predetermined value with respect to all the given values of p, the period estimation apparatus 10 determines that the value τ of the candidate period does not exist as the actual period. As a result, even when jitter is accumulated, the period estimation apparatus 10 can detect the periodic pulse train.

Second Embodiment

The following will describe a configuration of a period estimation apparatus 210 according to the second embodiment and procedures of processing of the period estimation apparatus 210 in the mentioned order, and will describe effects of the second embodiment at the end.

Figure 17:
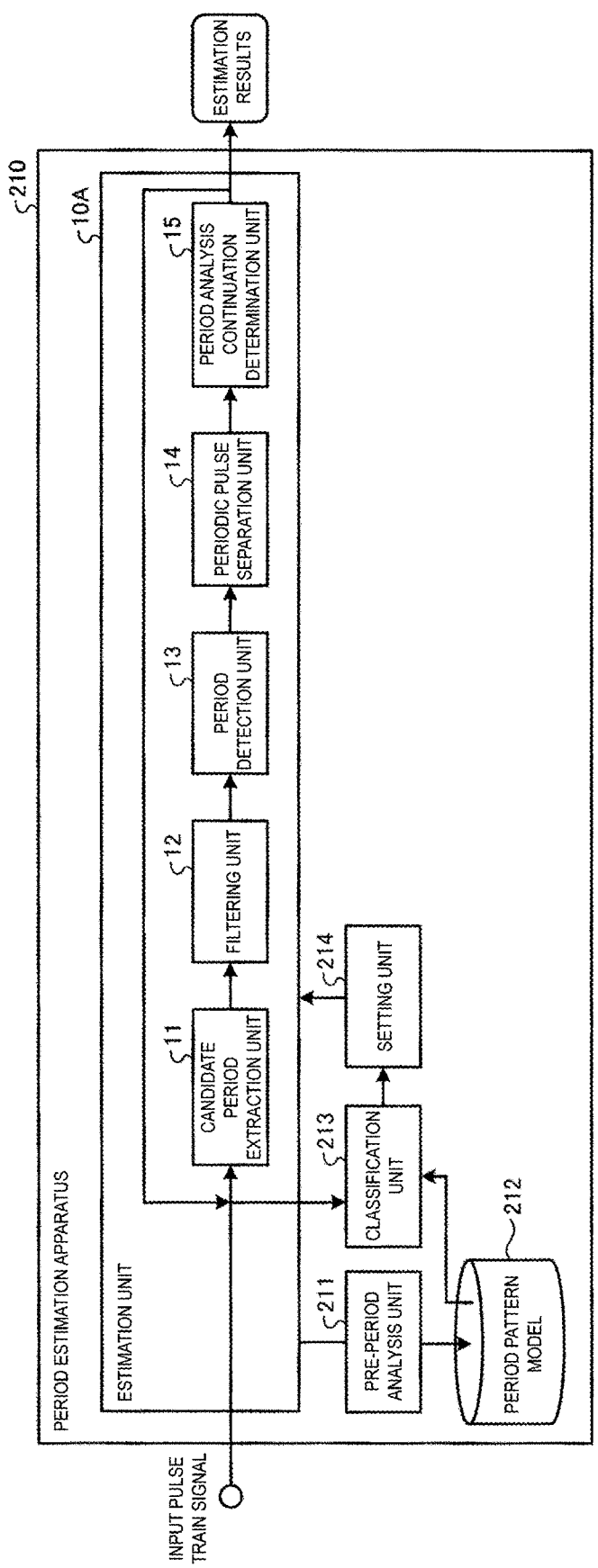
FIG. 17 is a block diagram illustrating an example of a configuration of a period estimation apparatus according to a second embodiment.

Configuration of Period Estimation Apparatus First, with reference to FIG. 17, a configuration of the period estimation apparatus 210 will be described. FIG. 17 is a block diagram illustrating an example of a configuration of the period estimation apparatus according to the second embodiment.

The period estimation apparatus 210 analyzes a period pattern of the input pulse train, and registers a type of the period pattern with a period pattern model in association with the input pulse train. Subsequently, the period estimation apparatus 210 classifies types of period patterns of subsequent input pulse trains by using the period pattern model. Then, the period estimation apparatus 210 performs analysis of the input pulse train by using a period estimation method limited to an optimal step, depending on the classified type of the period pattern. In this manner, the period estimation apparatus 10 reduces the calculation time, and also implements detection with optimal detection granularity.

As illustrated in FIG. 17, the period estimation apparatus 210 further includes a pre-period analysis unit 211 (analysis unit), a period pattern model 212, a classification unit 213, and a setting unit 214, in addition to an estimation unit 10A having the same configuration as the period estimation apparatus 10 according to the first embodiment. The period estimation apparatus 210 includes a storage unit (not illustrated). The storage unit is, for example, implemented by a semiconductor memory element such as a flash memory, or a storage apparatus such as a hard disk and an optical disc. Note that, other than the functional units illustrated in FIG. 17, the period estimation apparatus 210 may include various functional units included in a known computer, for example, functional units such as various input devices and audio output devices.

The pre-period analysis unit 211 performs pre-analysis of a period pattern of the input pulse train. First, as pre-analysis processing, the pre-period analysis unit 211 causes the estimation unit 10A to execute, for the input pulse train, the processing performed by the candidate period extraction unit 11, the processing performed by the filtering unit 12, the processing performed by the period detection unit 13, the processing performed by the periodic pulse separation unit 14, and the processing performed by the period analysis continuation determination unit 15, which are described in the first embodiment. Specifically, the pre-period analysis unit 211 causes the estimation unit 10A to execute the processing of Step S1 to Step S17 illustrated in FIG. 16.

Subsequently, the pre-period analysis unit 211 analyzes a type of the period pattern of the input pulse train, based on processing results of the estimation unit 10A, and registers the analyzed type of the period pattern with the period pattern model 212 in association with the input pulse train. The pre-period analysis unit 211 performs the pre-period analysis processing either for a certain time period or periodically, and in addition, performs the pre-period analysis for the input pulse train that cannot be subjected to the classification by the classification unit 213 (described below).

The period pattern model 212 registers the type of period pattern analyzed by the pre-period analysis unit 211 in association with the input pulse train. Then, the period pattern model 212 learns correspondence between the type of period pattern analyzed by the pre-period analysis unit 211 and the input pulse train, and when the input pulse train is input, the period pattern model 212 outputs the type of period pattern that corresponds to the input pulse train.

The classification unit 213 classifies a type of the period pattern of the input pulse train of a subsequent estimation target whose input is received by the period estimation apparatus 210, by using the period pattern model 212. The classification unit 213 inputs the input pulse train of the subsequent estimation target into the period pattern model 212, and receives output of the period pattern model 212, and thereby classifies the type of period pattern of the input pulse train of the subsequent estimation target.

The setting unit 214 sets a period estimation method for the input pulse train of the subsequent estimation target, according to the type of period pattern classified by the classification unit 213. The setting unit 214 sets a period estimation method in which the processing performed by the estimation unit 10A is partially limited, depending on the type of period pattern classified by the classification unit 213.

Figure 18:
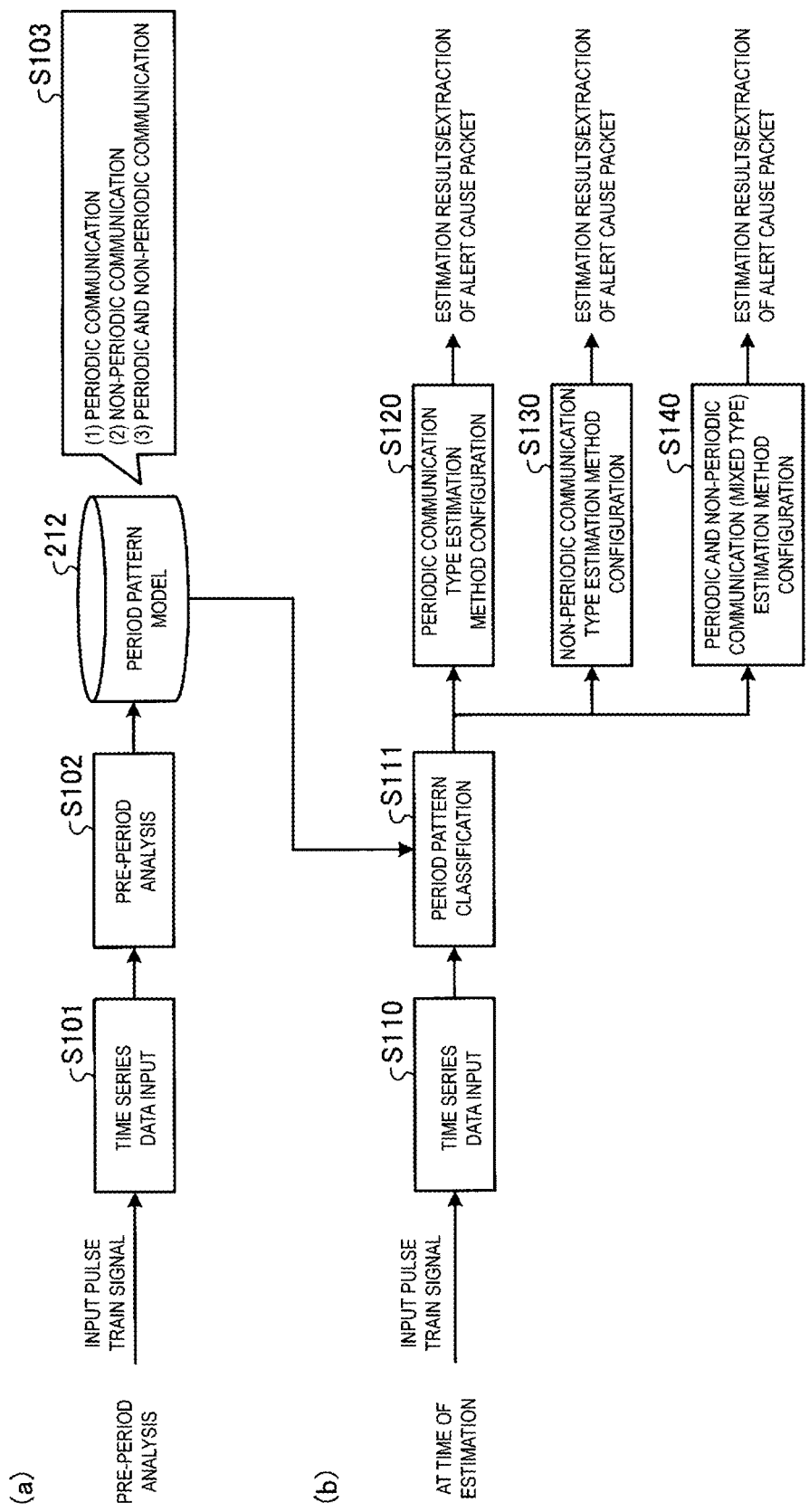
FIG. 18 is a diagram illustrating procedures of period determination processing for an input pulse train in the period estimation apparatus illustrated in FIG. 17.

Procedures of Period Estimation Processing Next, with reference to FIG. 18, procedures of the period determination processing for the input pulse train in the period estimation apparatus 210 will be described. FIG. 18 is a diagram illustrating procedures of the period determination processing for the input pulse train in the period estimation apparatus 210 illustrated in FIG. 17.

Figure 19:
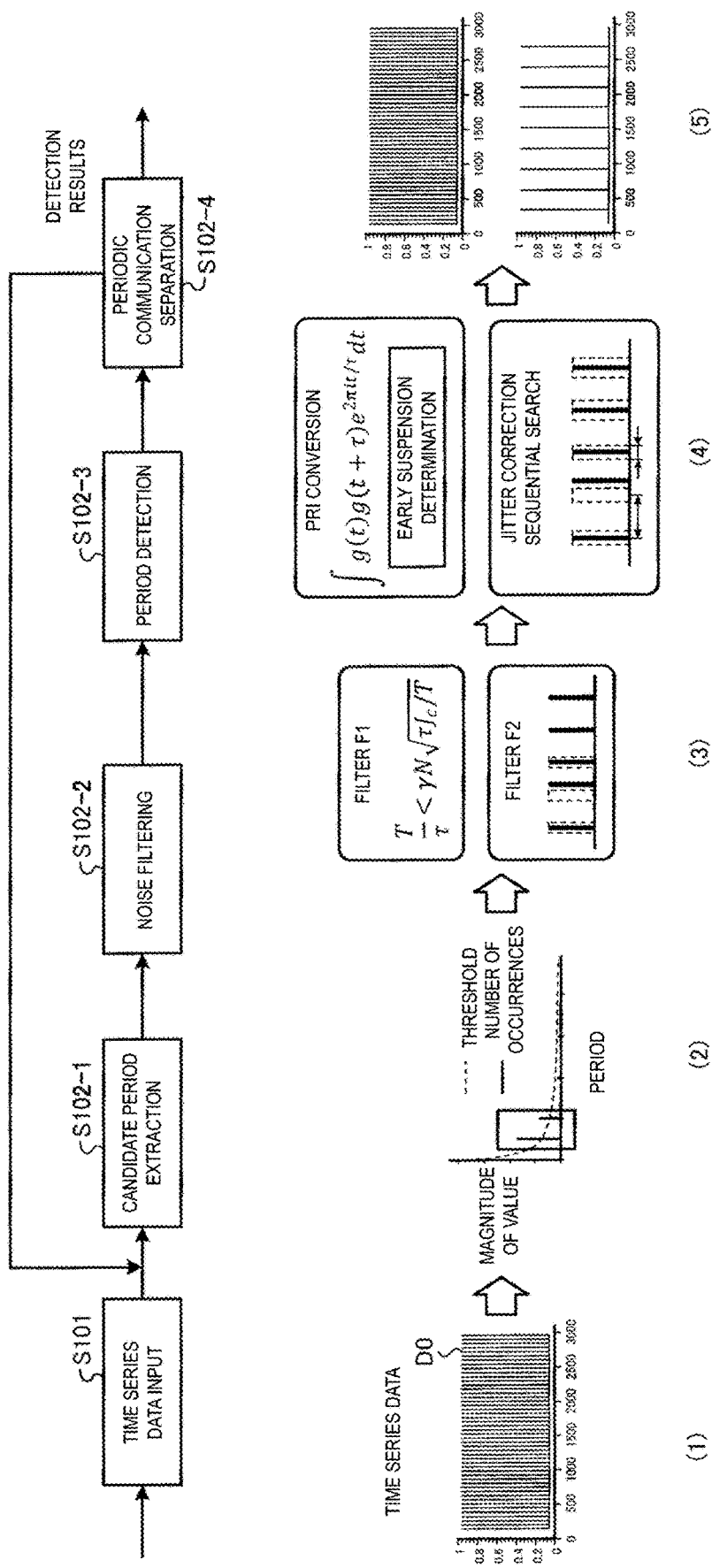
FIG. 19 is a diagram illustrating details of processing of pre-period analysis.

As illustrated in FIG. 18, the period estimation apparatus 210 performs pre-period analysis. Specifically, when the period estimation apparatus 210 receives input of an input pulse signal being time series data (Step S101), the pre-period analysis unit 211 performs the pre-period analysis of analyzing the period pattern of the input pulse train by causing the estimation unit 10A to execute the period determination processing for the input pulse train (Step S102). FIG. 19 is a diagram illustrating details of the processing of the pre-period analysis.

As illustrated in FIG. 19, at the time of the pre-period analysis, the estimation unit 10A executes, for input time series data D0 (see (1) of FIG. 19), the candidate period extraction performed by the candidate period extraction unit 11 ((2) and Step S102-1 of FIG. 19), the noise filtering performed by the filtering unit 12 (Step S102-2), the period detection performed by the period detection unit 13 (Step S102-3), the periodic communication separation performed by the periodic pulse separation unit 14 ((5) and Step S102-4 of FIG. 19), and the continuation determination processing performed by the period analysis continuation determination unit 15, in a manner similar to the period estimation processing according to the first embodiment illustrated in FIG. 16. The filtering unit 12 performs the noise filtering by applying filters F1 and F2 (see (3) of FIG. 19). The period detection unit 13 performs early suspension determination by means of PRI conversion and performs jitter correction sequential search (see (4) of FIG. 19). By performing the processing illustrated in FIG. 19, the estimation unit 10A detects determination of presence and absence of a communication period and extraction of a periodic value.

Figure 20:
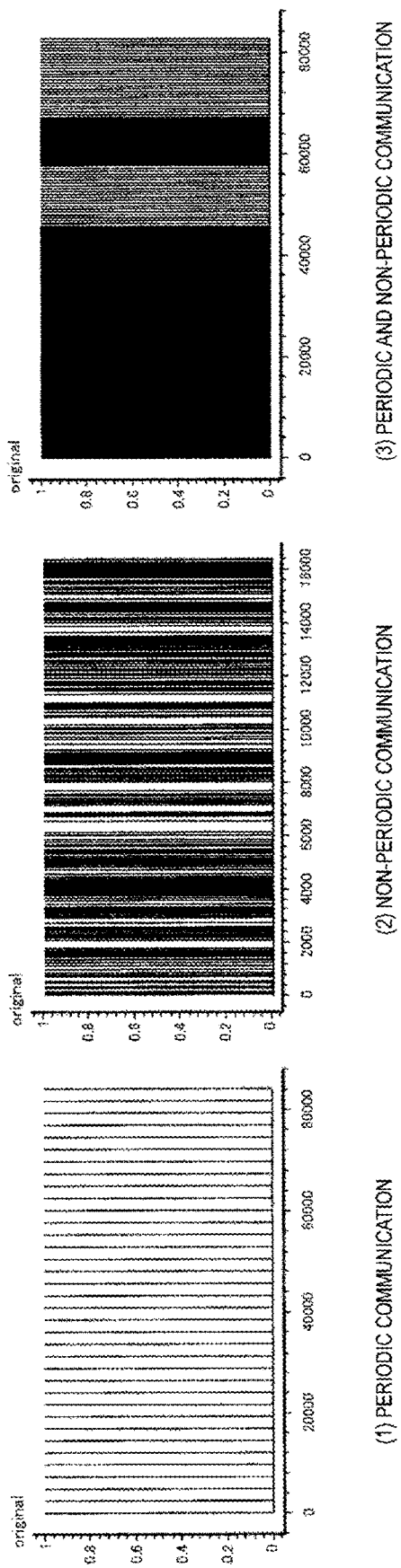
FIG. 20 is a diagram illustrating an example of a period pattern.

FIG. 20 is a diagram illustrating an example of the period pattern. The pre-period analysis unit 211 analyzes whether the period pattern of the input pulse train is a periodic communication type (see (1) of FIG. 18 and (1) of FIG. 20), a non-periodic communication type (see (2) of FIG. 18 and (2) of FIG. 20), or a mixed type including the periodic communication and the non-periodic communication (see (3) of FIG. 18 and (3) of FIG. 20), based on detection results of the estimation unit 10A. Then, the pre-period analysis unit 211 registers the analyzed type of the period pattern with the period pattern model 212 in association with the input pulse train. Then, the period pattern model 212 learns correspondence between the type of period pattern analyzed at the time of the pre-period analysis and the input pulse train.

Then, at the time of estimation, the period estimation apparatus 210 detects communication that deviates from the period pattern in normal operation learned at the time of the pre-period analysis. First, as illustrated in (b) of FIG. 18, in the period estimation apparatus 210, regarding the input pulse train of a subsequent estimation target whose input is received by the period estimation apparatus 210 (Step S110), the classification unit 213 classifies the period pattern by using the period pattern model 212 (Step S111), and the setting unit 214 sets a period estimation method according to classification results (Steps S120 to S140).

Specifically, in a case where the period pattern of the subsequent input pulse train is the periodic communication type, the setting unit 120 sets a periodic communication type estimation method (Step S120). In a case where the period pattern of the subsequent input pulse train is the non-periodic communication type, the setting unit 120 sets a non-periodic communication type estimation method (Step S130). In a case where the period pattern of the subsequent input pulse train is the mixed type including the periodic communication pattern and the non-periodic communication pattern, the setting unit 120 sets a mixed type estimation method (Step S140).

Figure 21:
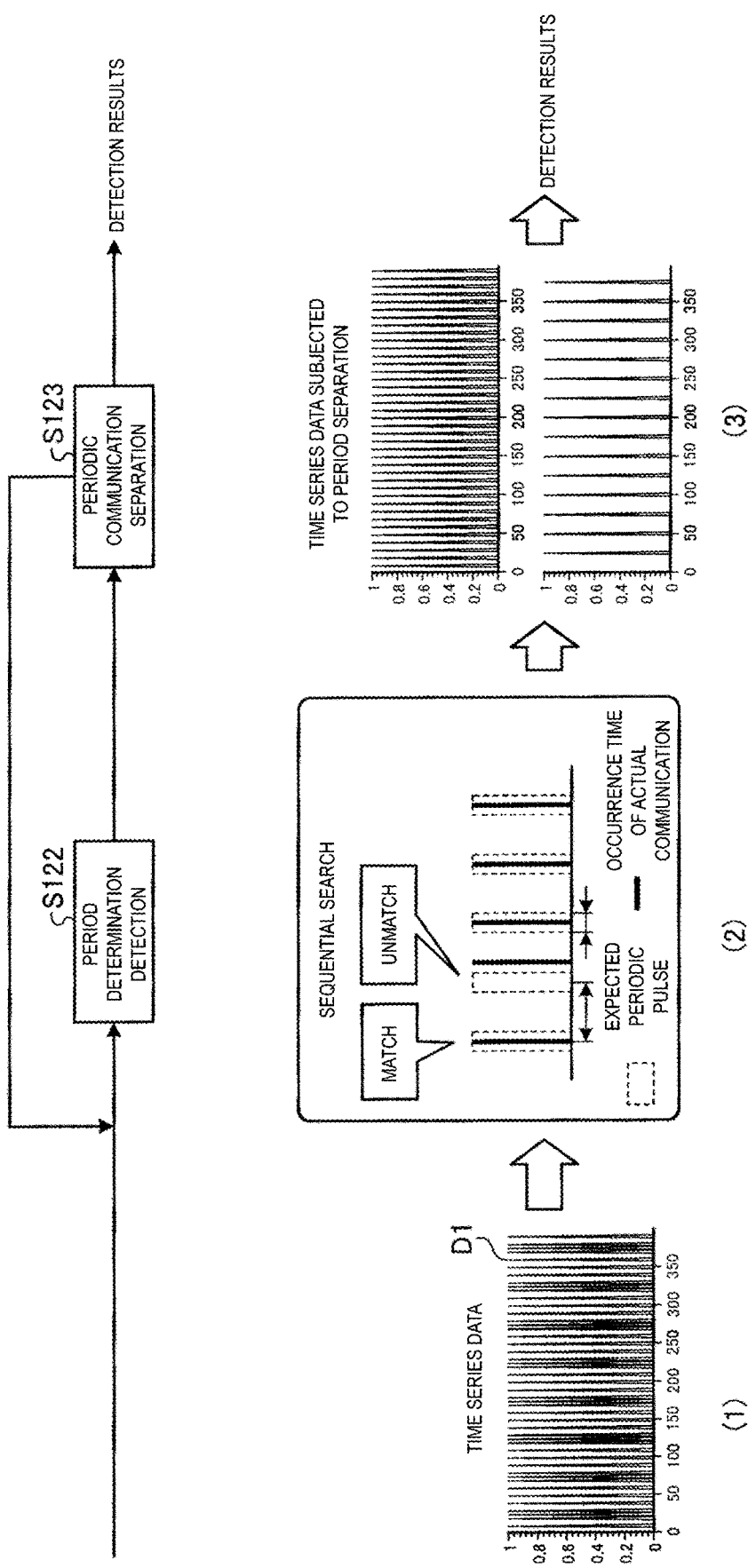
FIG. 21 is a diagram illustrating details of processing of a periodic communication type estimation method.

Periodic Communication Type Estimation Method Each of the estimation methods set by the setting unit 214 will be described. First, with reference to FIG. 21, the periodic communication type estimation method will be described. FIG. 21 is a diagram illustrating details of the processing of the periodic communication type estimation method. The periodic communication type estimation method is a period estimation method limited to the detection processing of the periodic pulse train using the sequential search performed by the period detection unit 13 and the processing performed by the periodic pulse separation unit 14, in comparison to the processing illustrated in FIG. 16.

As illustrated in FIG. 21, time series data D1 being the subsequent input pulse train (see (1) of FIG. 21) has a periodic pattern, and thus detection can be performed with the periodic communication type estimation method limited to the detection processing of the periodic pulse train using the sequential search performed by the period detection unit 13 ((2) and Step S122 of FIG. 21) and the periodic communication separation performed by the periodic pulse separation unit 14 ((3) and Step S123 of FIG. 21).

Figure 22:
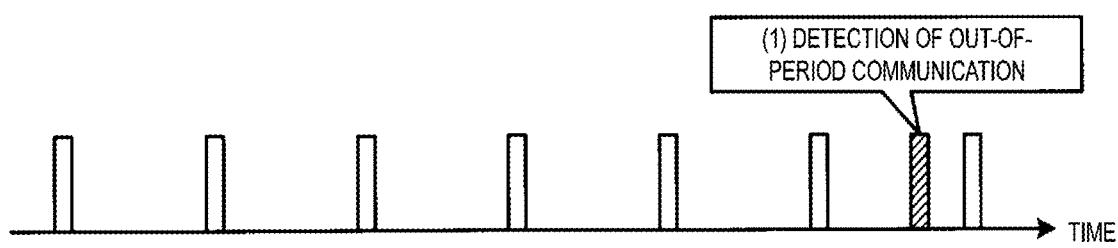
FIG. 22 is a diagram illustrating communication of a detection target.
Figure 23:
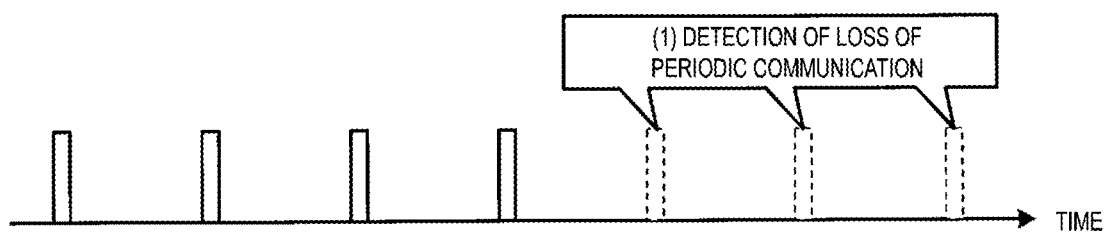
FIG. 23 is a diagram illustrating communication of a detection target.

FIGS. 22 and 23 are each a diagram illustrating communication of a detection target. According to the periodic communication type estimation method, the period estimation apparatus 210 can detect out-of-period communication (see (1) of FIG. 22) and periodic communication loss (see (1) of FIG. 23). The out-of-period communication is considered to be caused by insertion of an attack packet into regular data acquisition communication or the like. The periodic communication loss is considered to be caused by occurrence of non-arrival of a packet or the like due to address resolution protocol (ARP) spoofing and a system down attack.

When the periodic communication type estimation method is applied, the processing performed by the candidate period extraction unit 11, the processing performed by the filtering unit 12, and the PRI conversion processing in the period detection unit 13 are omitted, and thus the processing can be performed at higher speed in comparison to the processing illustrated in FIG. 16.

Figure 24:
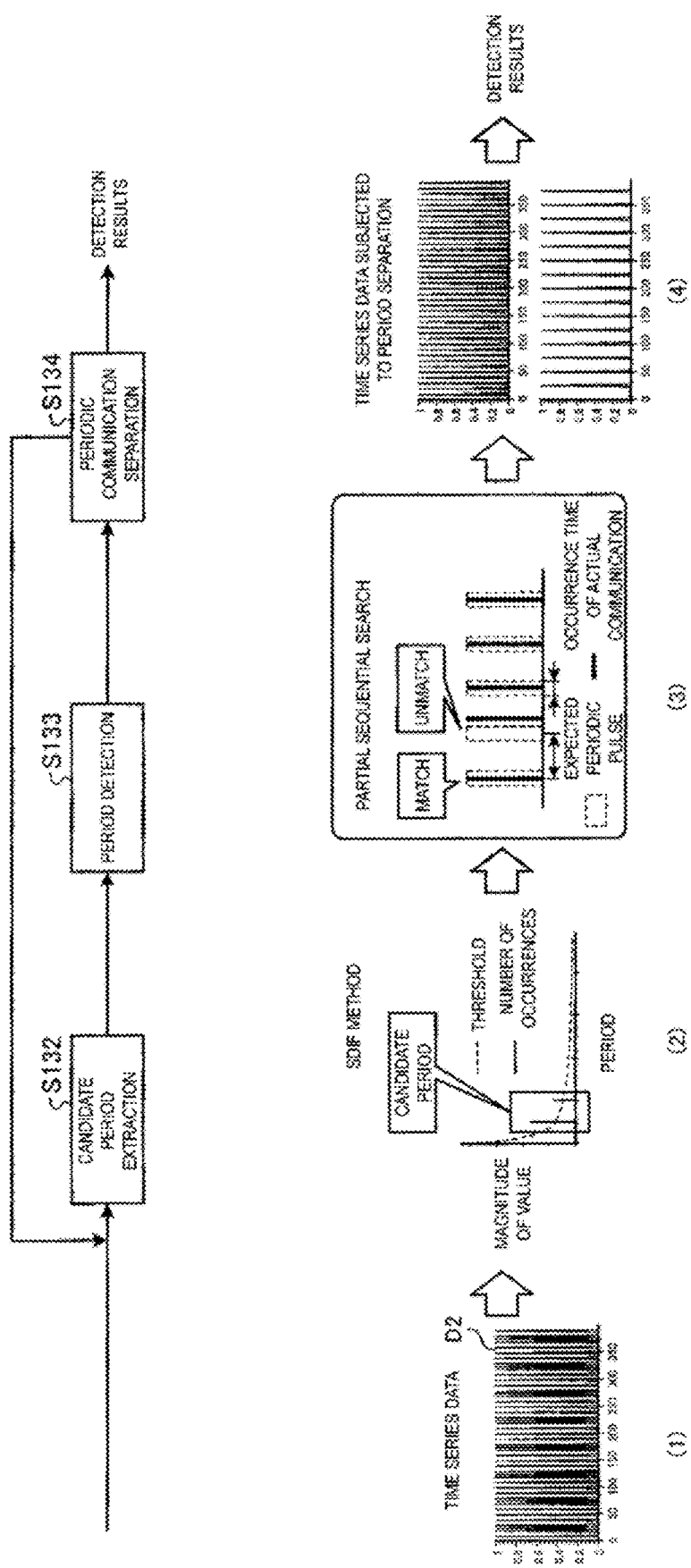
FIG. 24 is a diagram illustrating details of processing of a non-periodic communication type estimation method.

Non-Periodic Communication Type Estimation Method Subsequently, with reference to FIG. 24, the non-periodic communication type estimation method will be described. FIG. 24 is a diagram illustrating details of the processing of the non-periodic communication type estimation method. The non-periodic communication type estimation method is a period estimation method limited to the processing performed by the candidate period extraction unit 11, the detection processing of the periodic pulse train using the partial sequential search performed by the period detection unit 13, and the processing performed by the periodic pulse separation unit 14, in comparison to the processing illustrated in FIG. 16.

As illustrated in FIG. 24, time series data D2 being the subsequent input pulse train (see (1) of FIG. 24) has a non-periodic pattern, and thus detection can be performed with the non-periodic communication type estimation method described below. The method is the non-periodic communication type estimation method limited to the candidate period extraction (Step S132 of FIG. 21) using the SDIF method (see (2) of FIG. 24) performed by the candidate period extraction unit 11, the detection processing ((3) and Step S133 of FIG. 24) of the periodic pulse train using the partial sequential search performed by the period detection unit 13, and the periodic communication separation ((4) and Step S134 of FIG. 24) performed by the periodic pulse separation unit 14.

Figure 25:
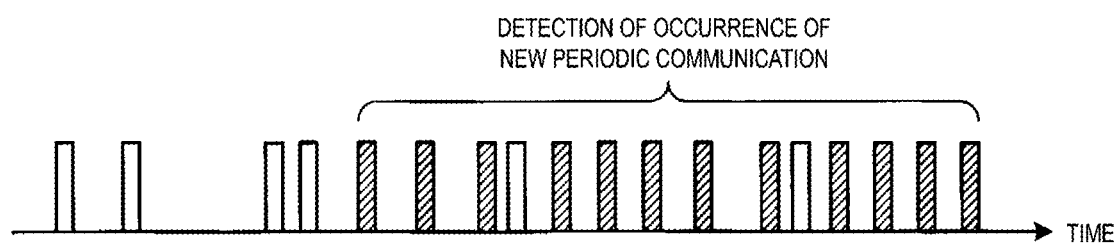
FIG. 25 is a diagram illustrating communication of a detection target.

FIG. 25 is a diagram illustrating communication of a detection target. When the non-periodic communication type estimation method is applied, by repeating partial period search in the sequential search, periodic communication that occurs only in a part of a time period of the observation time period can also be detected. In other words, as illustrated in FIG. 25, according to the non-periodic communication type estimation method, the period estimation apparatus 210 can detect occurrence of new periodic communication. The occurrence of such new periodic communication is considered to be caused by occurrence of continuous transmission of a malicious control command.

When the non-periodic communication type estimation method is applied, the processing performed by the filtering unit 12 and the PRI conversion processing in the period detection unit 13 are omitted, and thus the processing can be performed at higher speed in comparison to the processing illustrated in FIG. 16.

Figure 26:
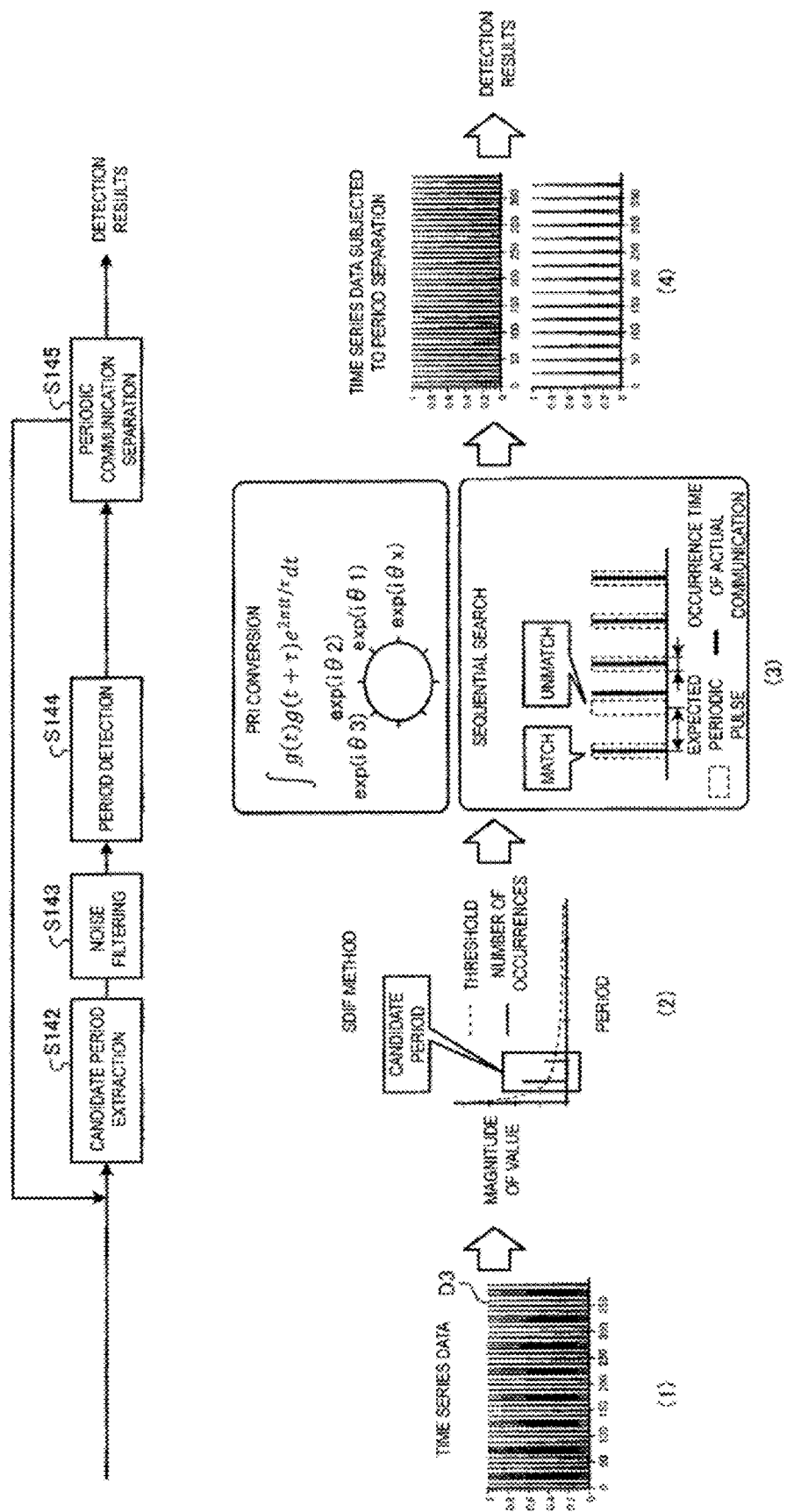
FIG. 26 is a diagram illustrating details of processing of a mixed type estimation method.

Mixed Type Estimation Method Subsequently, with reference to FIG. 26, the mixed type estimation method will be described. FIG. 26 is a diagram illustrating details of the processing of the mixed type estimation method. In the mixed type estimation method, the processing similar to the processing illustrated in FIG. 16 is performed. Specifically, in the mixed type estimation method, the candidate period extraction performed by the candidate period extraction unit 11 using the SDIF method ((2) and Step S142 of FIG. 26), the noise filtering performed by the filtering unit 12 (Step S143), the period detection using the PRI conversion and the sequential search performed by the period detection unit 13 ((3) and Step S144 of FIG. 26), and the periodic communication separation performed by the periodic pulse separation unit 14 ((4) and Step S145 of FIG. 26) are executed for input time series data D3 (see (1) of FIG. 26).

When the mixed type estimation method is applied, detection of communication having a complicated pattern including the periodic and non-periodic communications can also be supported, and new periodic communication that occurs only in a part of a time period of the observation time period can also be detected.

Detection Results Results obtained after detection is performed by using the period estimation apparatus 210 will be described. FIG. 27 is a diagram illustrating an example of detection results of the period estimation apparatus 210 illustrated in FIG. 17. As illustrated in FIG. 27, the period estimation apparatus 210 classifies the period pattern by using the period pattern model 212 learned in the pre-period analysis, and then performs period estimation. For this reason, in the period estimation apparatus 210, as illustrated in FIG. 27, analysis results can be output for each specified detection granularity (for example, a transmission source address (Src), a transmission destination address (dst), and a command (cmd)) out of information of the flow. By classifying the input pulse signal into period patterns and then performing period estimation in the period estimation apparatus 210, communication anomaly can be detected separately for out-of-period communication, periodic communication loss, or new period occurrence, according to the period pattern.

Figure 28:
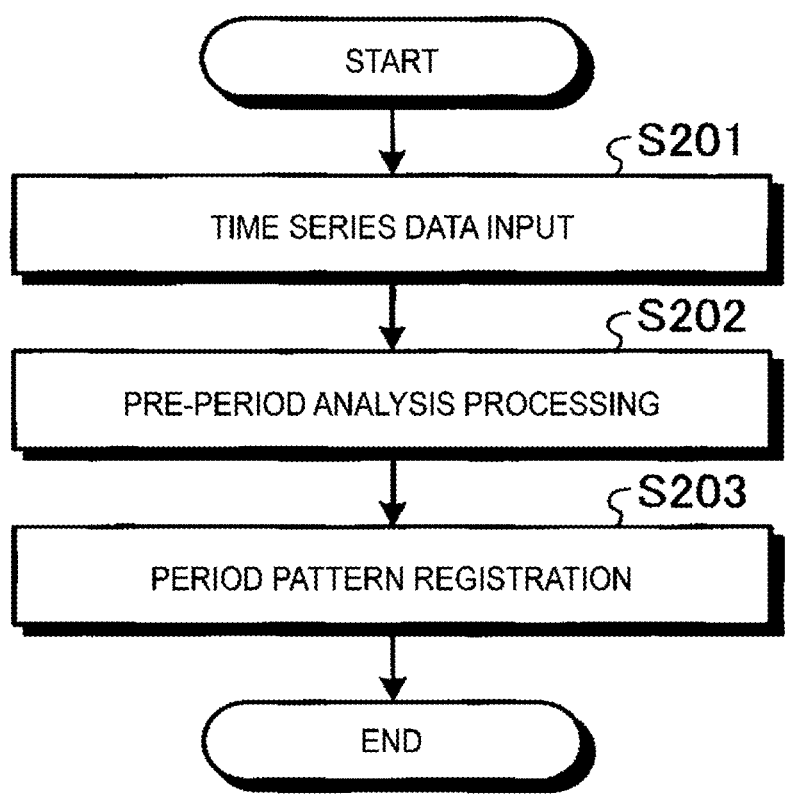
FIG. 28 is a flowchart illustrating an example of a processing procedure of period estimation processing at the time of pre-period analysis according to the second embodiment.

Processing Procedure at Time of Pre-Period Analysis Next, the processing procedure at the time of the pre-period analysis performed by the period estimation apparatus 210 will be described. FIG. 28 is a flowchart illustrating an example of the processing procedure of the period estimation processing at the time of the pre-period analysis according to the second embodiment.

When the period estimation apparatus 210 receives input of the time series data as the input pulse signal (Step S201), the period estimation apparatus 210 performs pre-period analysis processing for the time series data whose input has been received (Step S202). The period estimation apparatus 210 performs the same processing as Step S1 to Step S17 illustrated in FIG. 16 as the pre-period analysis processing. Then, the pre-period analysis unit 211 analyzes a type of the period pattern of the input pulse train, and registers the analyzed type of the period pattern with the period pattern model 212 in association with the input pulse train (Step S203). In the period pattern model 212, correspondence between the type of period pattern and the input pulse train is learned.

Figure 29:
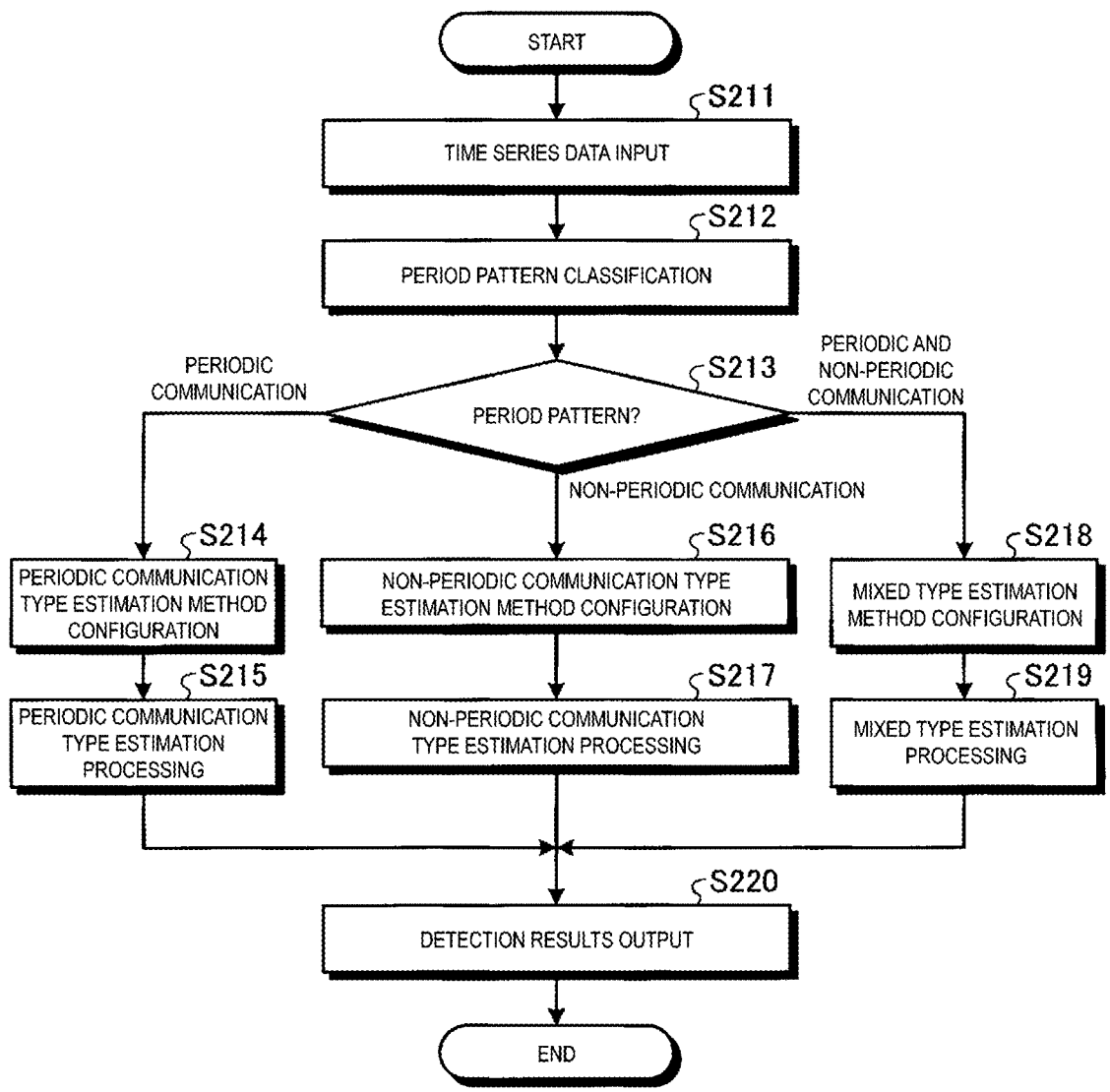
FIG. 29 is a flowchart illustrating an example of a processing procedure of period estimation processing at the time of estimation according to the second embodiment 2.

Processing Procedure of Estimation Processing Next, the processing procedure at the time of estimation of detecting communication that deviates from the period pattern in normal operation learned at the time of pre-period analysis will be described. FIG. 29 is a flowchart illustrating an example of the processing procedure of the period estimation processing at the time of estimation according to the second embodiment 2.

When the period estimation apparatus 210 receives input of the time series data as the subsequent input pulse train (Step S211), the classification unit 213 classifies the period pattern by using the period pattern model 212 for the time series data (Step S212).

In a case where classification results indicate the periodic communication type (Step S213: periodic communication), the setting unit 214 sets the periodic communication type estimation method (Step S214). The estimation unit 10A applies the periodic communication type estimation method, and performs the period estimation processing for the subsequent input pulse train (Step S215).

In a case where the classification results indicate the non-periodic communication type (Step S213: non-periodic communication), the setting unit 214 sets the non-periodic communication type estimation method (Step S216). The estimation unit 10A applies the periodic communication type estimation method, and performs the period estimation processing for the subsequent input pulse train (Step S217).

In a case where the classification results indicate the mixed type including the periodic communication pattern and the non-periodic communication pattern (Step S213: periodic and non-periodic communication), the setting unit 214 sets the mixed type estimation method (Step S218). The estimation unit 10A applies the mixed type estimation method, and performs the period estimation processing for the subsequent input pulse train (Step S219). Then, the period estimation apparatus 210 outputs detection results of the estimation unit 10A (Step S220), and ends the period estimation processing for the input pulse train. Note that, in Step S213, in a case where the input pulse train is not classified into any of the input patterns, the period estimation apparatus 210 executes Steps S202 and S203 illustrated in FIG. 28 for the input pulse train.

Effects of Second Embodiment As described above, the period estimation apparatus 210 according to the second embodiment analyzes a type of the period pattern of the input pulse train by causing execution of the pre-period analysis for the input pulse train, and registers the analyzed type of the period pattern with the period pattern model in association with the input pulse train. Further, the period estimation apparatus 210 classifies the type of period pattern of the input pulse train of the subsequent estimation target by using the period pattern model, and sets a method limited to a part of the processing of the period estimation processing and the period estimation method for the input pulse train of the subsequent estimation target depending on the classified type of period pattern. Accordingly, by optimizing the details of the processing of the period estimation processing according to the period pattern of the input pulse train being an estimation target, the period estimation apparatus 210 can further increase the speed of the period estimation processing than in the first embodiment. The period estimation apparatus 210 classifies the period pattern and then performs the period estimation, and can thus also implement detection with optimal detection granularity out of information of the flow.

System Configuration and the Like The respective components of the apparatuses, which have been illustrated, are functional and conceptual ones, and are not necessarily physically configured as illustrated. That is, a specific form of distribution and integration of the respective apparatuses is not limited to the illustrated one, and all or a portion thereof can be configured to be functionally or physically distributed and integrated in any units, according to various loads, use situations, and the like. Further, all or any portion of processing functions performed by each apparatus may be implemented by a CPU or a GPU and a program that is analyzed and executed by the CPU or the GPU, or may be implemented as hardware based on a wired logic.

All or a portion of the processing described as being automatically performed, among the processing described in the above-described embodiments, can also be manually performed, or all or a portion of the processing described as being manually performed can also be automatically performed by a known method. In addition, information including the processing procedures, control procedures, specific names, and various types of data or parameters illustrated in the aforementioned literatures or drawings can be freely changed unless otherwise specified.

Program A program in which the processing executed by the period estimation apparatus 10 described in the above-described embodiments is described in a computer-executable language can also be created. For example, it is also possible to create the period estimation program for a pulse train signal in which processing executed by the period estimation apparatus 10 according to the embodiments is described in a computer-executable language. In this case, when the computer executes the period estimation program for a pulse train signal, effects similar to those of the above-described embodiments can be obtained. In addition, processing similar to that of the above-described embodiments may be implemented by recording the period estimation program for a pulse train signal in a computer-readable recording medium and causing the computer to read and execute the period estimation program for a pulse train signal recorded in the recording medium.

Figure 30:
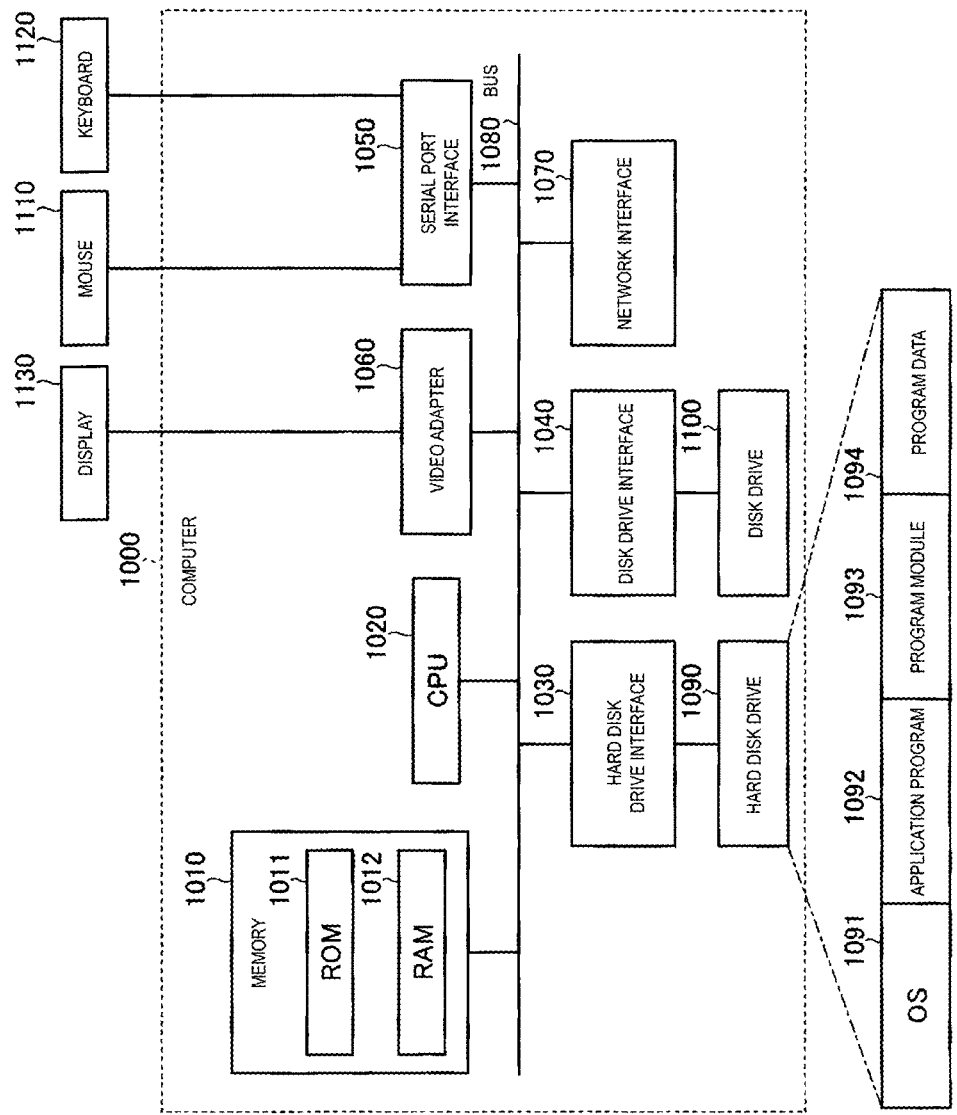
FIG. 30 is a diagram illustrating an example of a computer that executes a period estimation program for a pulse train signal.

FIG. 30 is a diagram illustrating an example of the computer that executes the period estimation program for a pulse train signal. As illustrated in FIG. 30, a computer 1000 includes, for example, a memory 1010, a CPU 1020, a hard disk drive interface 1030, a disk drive interface 1040, a serial port interface 1050, a video adapter 1060, and a network interface 1070, and each of these units is connected by a bus 1080.

As illustrated in FIG. 30, the memory 1010 includes a read only memory (ROM) 1011 and a RAM 1012. The ROM 1011 stores, for example, a boot program such as a basic input output system (BIOS). As illustrated in FIG. 30, the hard disk drive interface 1030 is connected to a hard disk drive 1090. As illustrated in FIG. 30, the disk drive interface 1040 is connected to a disk drive 1100. A detachable storage medium such as a magnetic disk or optical disc, for example, is inserted into the disk drive 1100. As illustrated in FIG. 30, the serial port interface 1050 is, for example, connected to a mouse 1110 and a keyboard 1120. As illustrated in FIG. 30, the video adapter 1060 is, for example, connected to a display 1130.

Here, as illustrated in FIG. 30, the hard disk drive 1090 stores, for example, an OS 1091, an application program 1092, a program module 1093, and program data 1094. Specifically, the period estimation program for a pulse train signal is, for example, stored in the hard disk drive 1090 as a program module in which instructions to be executed by the computer 1000 are described.

The various pieces of data described in the above-described embodiments are, for example, stored in the memory 1010 or the hard disk drive 1090 as the program data. Then, the CPU 1020 reads the program module 1093 or the program data 1094 stored in the memory 1010 or the hard disk drive 1090 in the RAM 1012 as necessary, and executes the various processing procedures.

Note that the program module 1093 or the program data 1094 related to the period estimation program for a pulse train signal is not limited to the case in which they are stored in the hard disk drive 1090 and may be stored in a removable storage medium, for example, and may be read by the CPU 1020 via the disk drive or the like. Alternatively, the program module 1093 or the program data 1094 related to the period estimation program for a pulse train signal may be stored in another computer connected via a network (a LAN, a wide area network (WAN), or the like) and may be read by the CPU 1020 via the network interface 1070.

The above-described embodiments, and variations thereof, are within the scope of the invention and equivalents thereof set forth in the aspects, as included in the technology disclosed herein.

REFERENCE SIGNS LIST 10, 210 Period estimation apparatus
10A Estimation unit
11 Candidate period extraction unit
12 Filtering unit
13 Period detection unit
14 Periodic pulse separation unit
15 Period analysis continuation determination unit
211 Pre-period analysis unit
212 Period pattern model
213 Classification unit
214 Setting unit

The invention claimed is:

1. A period estimation apparatus for a pulse train signal, the period estimation apparatus comprising:
processing circuitry configured to:
extract candidate periods being a target of period determination from an input pulse train;
use at least one of the candidate periods extracted to determine whether the at least one of the candidate periods exists as an actual period, and, when determining that the at least one of the candidate periods does not exist as the actual period, suspend the period determination for the at least one of the candidate periods;
perform the period determination for the at least one of the candidate periods determined to exist as the actual period, generate a pseudo periodic pulse train based on the at least one of the candidate periods, adjust, based on a differential value between the pseudo periodic pulse train generated and the input pulse train, a pulse position of the pseudo periodic pulse train, and detect a periodic pulse train according to results of the period determination and adjustment;
separate the periodic pulse train detected from the input pulse train, and input a separated pulse train as a new input pulse train; and
determine whether analysis of a period is to be continued, based on one or more of a parameter related to extraction of the candidate periods and the new input pulse train.

2. The period estimation apparatus according to claim 1, wherein the processing circuitry is further configured to calculate pulse intervals of the input pulse train based on a specific difference to generate a histogram, and in the histogram generated, extract pulse intervals that occur a number of times being equal to or larger than a predetermined threshold as the candidate periods.

3. The period estimation apparatus according to claim 1, wherein the processing circuitry is further configured to:
when expression (1) below is satisfied, determine that the at least one of the candidate periods does not exist as the actual period,

[Math. 1]

$$\frac{T}{\tau} < \gamma \sqrt{\tau Jc/t} \qquad (1)$$

where, in the expression (1), T represents an observation time period of the input pulse train, τ represents a value of a candidate period of the candidate periods, γ represents a constant, and Jc represents an allowable jitter rate.

4. The period estimation apparatus according to claim 1, wherein under definition that p represents an initial pulse position, τ represents a pulse interval being a value of a candidate period of the candidate periods, and Jc represents an allowable jitter rate, the processing circuitry is further configured to generate a pseudo periodic pulse train q(t) having a total number X of pulses with a pulse width being 2Jcτ, when g(t) represents the input pulse train and time t is changed from 0 to an observation time period T of the input pulse train g(t), count a number of overlapping pulses between the pseudo periodic pulse train q(t) and the input pulse train g(t), when the number of overlapping pulses is equal to or larger than the total number X of pulses, output the value τ of the candidate period, when the number of overlapping pulses is smaller than the total number X of pulses, change a value of the p and count the number of overlapping pulses again, and when the number of overlapping pulses falls below the total number X of pulses with respect to all of given values of the p, determine that the at least one of the candidate periods does not exist as the actual period.

5. The period estimation apparatus according to claim 1, wherein the processing circuitry is further configured to:
in the period determination, when expression (2) below is satisfied during execution of PRI conversion, suspend the PRI conversion,

[Math. 2]

$$Dn+(T-TOAn)/\tau<TH \qquad (2)$$

where, in the expression (2), Dn represents a spectrum of the PRI conversion when the analysis is performed up to an n-th pulse, T represents an observation time period of the input pulse train, TOAn represents occurrence time of the n-th pulse, τ represents a value of a candidate period of the candidate periods, and Th represents a threshold of the period determination.

6. The period estimation apparatus according to claim 1, wherein under definition that p represents an initial pulse position, τ represents a pulse interval being a value of a candidate period of the candidate periods input, and Jc represents an allowable jitter rate, the processing circuitry is further configured to generate a pseudo periodic pulse train q(t) with a pulse width being 2Jcτ, when g(t) represents the input pulse train, time t is changed from 0 to an observation time period T of the input pulse train g(t), and the pseudo periodic pulse train q(t) and the input pulse train g(t) overlap with each other, count the number of overlapping pulses, and regarding each of the overlapping pulses, calculate a differential value δn' being obtained by subtracting a center position of an overlapping pulse of the pseudo periodic pulse train q(t) from a position of an overlapping pulse of the input pulse train g(t), calculate a movement value δn based on the differential value δn' calculated and a movement value δn−1 immediately preceding the differential value δn', and move a subsequent pulse position of the overlapping pulse of the pseudo periodic pulse train q(t) immediately preceding by the movement value δn in parallel, when the final number of overlapping pulses is equal to or larger than a predetermined value, perform detection of the periodic pulse train based on the value τ of the candidate period input, when the final number of overlapping pulses is smaller than the predetermined value, change the value of the p and count the number of overlapping pulses again, and when the number of overlapping pulses falls below the predetermined value with respect to all of given values of the p, determine that the value τ of the candidate period does not exist as the actual period.

7. The period estimation apparatus according to claim 1, wherein the processing circuitry is further configured to:
analyze a type of period pattern of the input pulse train by causing execution of processing performed for the input pulse train, and register the type of period pattern analyzed with a period pattern model in association with the input pulse train,
classify the type of period pattern of the input pulse train of a subsequent estimation target by using the period pattern model, and
set a period estimation method for the input pulse train of the subsequent estimation target according to the type of period pattern classified.

8. The period estimation apparatus according to claim 7, wherein the type of period pattern is a periodic communication type in which a communication pattern is periodic, a non-periodic communication type in which the communication pattern is non-periodic, or a mixed type including a periodic communication pattern and a non-periodic communication pattern.

9. The period estimation apparatus according to claim 8, wherein the processing circuitry is further configured to set a period estimation method limited to detection processing of the periodic pulse train using sequential search performed, and processing performed, for the input pulse train of the subsequent estimation target classified as the periodic communication type.

10. The period estimation apparatus according to claim 8, wherein the processing circuitry is further configured to set a period estimation method limited to processing performed, detection processing of the periodic pulse train using partial sequential search performed, and processing performed, for the input pulse train of the subsequent estimation target classified as the non-periodic communication type.

11. The period estimation apparatus according to claim 8, wherein the processing circuitry is further configured to set a period estimation method of executing processing performed for the input pulse train of the subsequent estimation target classified as the mixed type.

12. A period estimation method for a pulse train signal executed by a period estimation apparatus, the period estimation method comprising:
  extracting candidate periods being a target of period determination from an input pulse train;
  using at least one of the candidate periods extracted to determine whether the at least one of the candidate periods exists as an actual period, and, when the at least one of the candidate periods is determined not to exist as the actual period, suspending the period determination for the at least one of the candidate periods;
  performing the period determination for the at least one of the candidate periods determined to exist as the actual period and detecting a periodic pulse train according to results of the period determination;
  separating the periodic pulse train detected from the input pulse train, and inputting a separated pulse train as a new input pulse train in the extracting; and
  determining whether analysis of a period is to be continued, based on one or more of a parameter related to extraction of the candidate periods and the new input pulse train.

13. A non-transitory computer-readable recording medium storing therein a period estimation program that causes a computer to execute a process comprising:
  extracting candidate periods being a target of period determination from an input pulse train;
  using at least one of the candidate periods extracted to determine whether the at least one of the candidate periods exists as an actual period, and, when the at least one of the candidate periods is determined not to exist as the actual period, suspending the period determination for the at least one of the candidate periods;
  performing the period determination for the at least one of the candidate periods determined to exist as the actual period and detecting a periodic pulse train according to results of the period determination;
  separating the periodic pulse train detected from the input pulse train, and inputting a separated pulse train as a new input pulse train in the extracting; and
  determining whether analysis of a period is to be continued, based on one or more of a parameter related to extraction of the candidate periods and the new input pulse train.

* * * * *